US010109512B2

(12) United States Patent
Balucani

(10) Patent No.: US 10,109,512 B2
(45) Date of Patent: Oct. 23, 2018

(54) PHOTOVOLTAIC CELL WITH POROUS SEMICONDUCTOR REGIONS FOR ANCHORING CONTACT TERMINALS, ELECTROLITIC AND ETCHING MODULES, AND RELATED PRODUCTION LINE

(71) Applicant: Rise Technology S.R.L., Rome (IT)

(72) Inventor: Marco Balucani, Rome (IT)

(73) Assignee: Rise Technology S.R.L., Rome (IT)

( * ) Notice: Subject to any disclaimer, the term of this patent is extended or adjusted under 35 U.S.C. 154(b) by 0 days.

(21) Appl. No.: 15/711,963

(22) Filed: Sep. 21, 2017

(65) Prior Publication Data

US 2018/0012782 A1 Jan. 11, 2018

Related U.S. Application Data

(62) Division of application No. 13/634,238, filed as application No. PCT/EP2011/053739 on Mar. 11, 2011.

(51) Int. Cl.
*C03C 15/00* (2006.01)
*H01L 21/67* (2006.01)
(Continued)

(52) U.S. Cl.
CPC ........ *H01L 21/67173* (2013.01); *C25D 5/026* (2013.01); *C25D 5/04* (2013.01);
(Continued)

(58) Field of Classification Search
CPC . H01L 21/288; H01L 21/2885; H01L 21/306; H01L 21/3063; H01L 21/465; C25D 7/12
(Continued)

(56) References Cited

U.S. PATENT DOCUMENTS 3,162,589 A 12/1964 Pensak
2005/0217135 A1 10/2005 O'Donnell et al.
(Continued)

FOREIGN PATENT DOCUMENTS

CN 1725449 A 1/2006
CN 1842618 A 10/2006
(Continued)

OTHER PUBLICATIONS

Japanese Patent Office, "Decision of Refusal from JP Application No. 2012-557505", "from Foreign Couterpart of U.S. Appl. No. 13/634,238", dated Apr. 5, 2016, pp. 1-2, Published in: JP.
(Continued)

*Primary Examiner* — Binh X Tran
(74) *Attorney, Agent, or Firm* — Fogg & Powers LLC

(57) ABSTRACT

A photovoltaic cell is proposed. The photovoltaic cell includes a substrate of semiconductor material, and a plurality of contact terminals each one arranged on a corresponding contact area of the substrate for collecting electric charges being generated in the substrate by the light. For at least one of the contact areas, the substrate includes at least one porous semiconductor region extending from the contact area into the substrate for anchoring the whole corresponding contact terminal on the substrate. In the solution according to an embodiment of the invention, each porous semiconductor region has a porosity decreasing moving away from the contact area inwards the substrate. An etching module and an electrolytic module for processing photovoltaic cells, a production line for producing photovoltaic cells, and a process for producing photovoltaic cells are also proposed.

16 Claims, 22 Drawing Sheets

(51) Int. Cl.

| | |
|---|---|
| *C25D 17/00* | (2006.01) |
| *C25D 5/04* | (2006.01) |
| *C25D 5/02* | (2006.01) |
| *H01L 31/0224* | (2006.01) |
| *C25D 11/02* | (2006.01) |
| *C25D 7/12* | (2006.01) |

(52) U.S. Cl.
CPC .............. *C25D 7/12* (2013.01); *C25D 11/02* (2013.01); *C25D 17/00* (2013.01); *C25D 17/001* (2013.01); *H01L 21/6708* (2013.01); *H01L 21/6723* (2013.01); *H01L 21/67236* (2013.01); *H01L 31/022425* (2013.01); *Y02E 10/50* (2013.01)

(58) Field of Classification Search
USPC ........................................ 216/56, 86, 88, 91
See application file for complete search history.

(56) References Cited

U.S. PATENT DOCUMENTS

| | | | |
|---|---|---|---|
| 2006/0260932 A1* | 11/2006 | Ravkin | C25D 5/026 204/222 |
| 2008/0149147 A1* | 6/2008 | Wilcoxson | B08B 3/04 134/95.2 |
| 2009/0114249 A1 | 5/2009 | Mikhaylichenko et al. | |
| 2009/0188553 A1 | 7/2009 | Dubin | |
| 2011/0318872 A1 | 12/2011 | Becker et al. | |
| 2013/0061920 A1* | 3/2013 | Balucani | C25D 7/12 136/256 |
| 2017/0186890 A1 | 6/2017 | Balucani | |

FOREIGN PATENT DOCUMENTS

| | | |
|---|---|---|
| CN | 101405852 A | 4/2009 |
| EP | 1612845 A2 | 1/2006 |
| JP | H06275598 A | 9/1994 |
| JP | 2001203184 A | 7/2001 |
| JP | 20020146595 A | 5/2002 |
| JP | 2006508789 A | 3/2006 |
| JP | 2007521391 A | 8/2007 |
| JP | 2009532578 A | 9/2009 |
| WO | 2004050246 A1 | 6/2004 |
| WO | 2005005692 A1 | 1/2005 |
| WO | 2007104799 A1 | 9/2007 |
| WO | 2007123677 A2 | 11/2007 |

OTHER PUBLICATIONS

State Intellectual Property Office of the People's Republic of China, "Third Office Action from CN Application No. 201180020401.8 dated Jun. 2, 2016", "from Foreign Couterpart of U.S. Appl. No. 13/634,238", Jun. 2, 2016, pp. 1-7, Published in: CN.

U.S. Patent and Trademark Office, "Office Action for U.S. Appl. No. 15/456,426", dated Feb. 13, 2018, pp. 1-23, Published in: US.

U.S. Patent and Trademark Office, "Restriction Requirement for U.S. Appl. No. 13/634,238", dated Jan. 5, 2015, pp. 1-7, Published in: US.

United States Patent and Trademark Office, "Advisory Action", "from U.S. Appl. No. 13/634,238", dated Apr. 4, 2016, pp. 1-3, Published in: US.

United States Patent and Trademark Office, "Final Office Action", "from U.S. Appl. No. 13/634,238", dated Nov. 20, 2015, pp. 1-26, Published in: US.

United States Patent and Trademark Office, "Office Action", "from U.S. Appl. No. 13/634,238", dated Mar. 27, 2015, pp. 1-21, Published in: US.

United States Patent and Trademark Office, "Restriction Requirement for U.S. Appl. No. 15/456,426", dated Mar. 30, 2017, pp. 1-6, Published in: US.

United States Trademark and Patent Office, "Office Action", "from U.S. Appl. No. 13/634,238", dated Sep. 22, 2016, pp. 1-29, Published in: US.

* cited by examiner

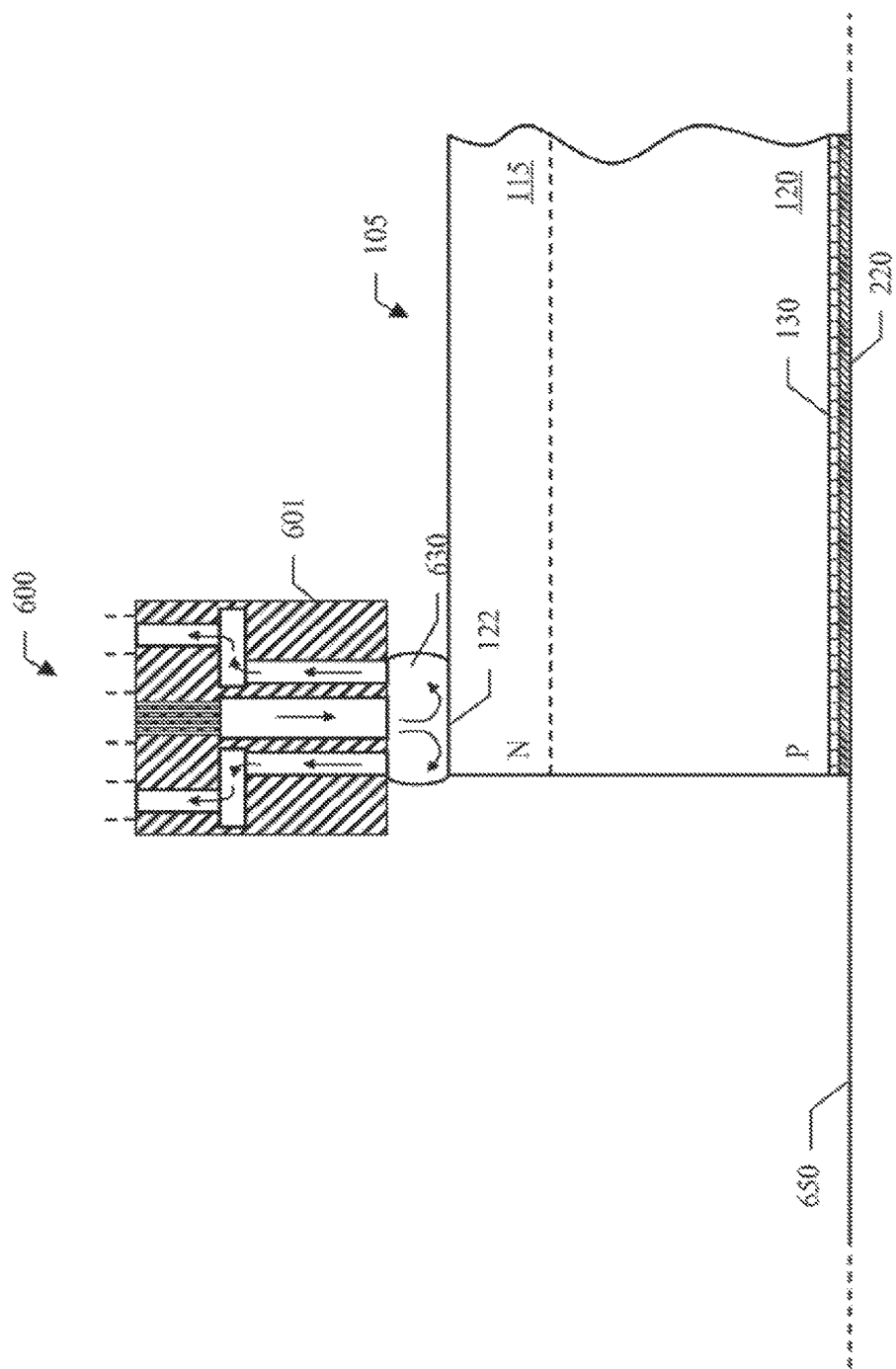

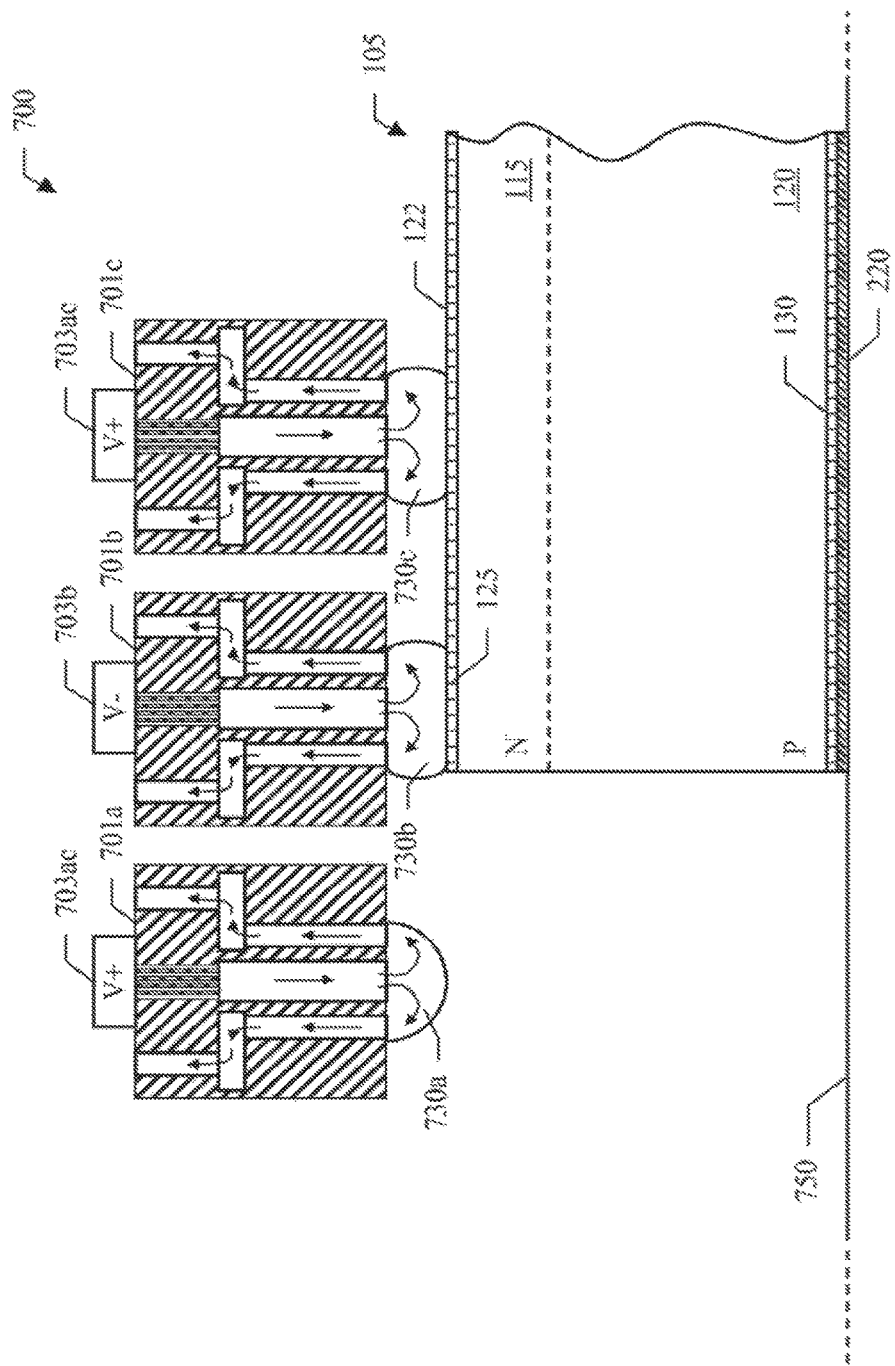

US 10,109,512 B2

PHOTOVOLTAIC CELL WITH POROUS SEMICONDUCTOR REGIONS FOR ANCHORING CONTACT TERMINALS, ELECTROLITIC AND ETCHING MODULES, AND RELATED PRODUCTION LINE

PRIORITY CLAIM

The present application is a division of U.S. patent application Ser. No. 13/634,238, filed Nov. 26, 2012 which is a national phase application filed pursuant to 35 USC § 371 of International Patent Application Serial No. PCT/EP2011/053739, filed Mar. 11, 2011, which further claims the benefit of Italian Patent Application Serial No. MI2010A000407 filed Mar. 12, 2010; all of the foregoing applications are incorporated herein by reference in their entireties.

TECHNICAL FIELD

One or more embodiments relate to the field of photovoltaic applications. More specifically, one or more embodiments relate to photovoltaic cells. Moreover, further embodiments relate to the field of electrolytic processes and to the field of etching processes. More specifically, these embodiments relate to electrolytic modules (for example, for performing anodization processes and deposition processes) and to etching modules—for example, for use in production lines of photovoltaic cells.

BACKGROUND

Photovoltaic cells are commonly used to convert light energy into electric energy (being also known as solar cells for use with the sun light). The most common type of solar cell is based on a semiconductor substrate (for example, made of silicon), wherein a PN junction is formed between a front surface and a back surface thereof; the sun light that is absorbed by the front surface of the substrate generates electric charges (i.e., electron-hole pairs), which supply a corresponding current to an external load.

Each solar cell generally has a front contact terminal on the front surface and a back contact terminal on the back surface for its coupling to the external load. The back contact terminal may extend throughout the whole back surface (since it is usually not reached by the sun light), so that it may be relatively thin. Conversely, the front contact terminal is typically maintained as small as possible, in order to limit the obscuring of the front surface to the sun light (for example, in the form of a grid with narrow contact strips); therefore, the front contact terminal is typically relatively thick (to reduce its resistance along the contact strips on the front surface).

A problem of each solar cell known in the art is the difficulty of maintaining the contact terminals fixed on the substrate, especially for the front contact terminal because of its small size and high thickness. Indeed, even a slight loss of adhesion of each contact terminal involves a non-uniformity or instability of its contact resistance, thereby causing a current concentration on the rest of the contact terminal; as a result, the contact terminal heats up with its progressive loss of adhesion. All of the above has a detrimental effect on the efficiency of the solar cell.

For this purpose, several techniques have been proposed to improve the adhesion of the front contact terminal (and of the back contact terminal as well) on the substrate.

For example, a known technique is based on applying a metal paste (for example, by a screen-printing process), and then performing a firing process (so as to anchor the metal paste on the substrate). However, the firing process requires the application of very high temperatures (of the order of 400-750° C.), which induce mechanical stresses on the solar cell (because of the different thermal expansion coefficients of its materials). Therefore, the solar cell is maintained relatively thick (for example, with a thickness of at least 150-200 μm), in order to sustain these mechanical stresses without cracking. The application of the metal paste also involves high production costs. Moreover, the metal paste provides a relatively high resistance of the contact terminals (which adversely affect the efficiency of the solar cell).

Another known technique is instead based on forming grooves on the front surface of the substrate (for example, by a laser ablation process), and then depositing a metal layer into them; these groves are relatively deep (for example, 3-60 μm), so that the front contact terminal so obtained is buried (at least partially) into the substrate (thereby remaining mechanically anchored to it). However, the groves weaken the mechanical structure of the solar cell. Therefore, as above the solar cell is maintained relatively thick (in order to avoid its cracking).

Porous silicon is also used in the production of the solar cells to form an antireflection coating (ARC) on the font surface of the substrate.

For example, Vinod et al., "The ohmic properties and current-voltage characteristics of the screen-printed silicon solar cells with porous silicon surface", Solid State Communications, Pergamon, GB LNKD—DOI:10.1016/J.SSC.2009.02.019, vol. 149, no. 23-24, pages 957-961, XP026098082 ISSN: 0038-1098 (the entire disclosure of which is herein incorporated by reference) indicates that the solar cells may be produced forming the contact terminals by a screen printing step of an Ag paste followed by its firing (at 725° C.); the porous silicon is then formed by electrochemical etching on the $n^+$-Si surface (in most cases without any protective cover of the Ag contacts). Alternatively (in order to avoid corresponding problems), the same document also indicates that the porous silicon may be formed first followed by the formation of the Ag contacts thereon; a firing step at 700-825° C. following by an annealing step at 450° C. are then performed to facilitate the formation of an ohmic contact between Ag and $n^+$-Si (by driving molten glass frit contained in the Ag contacts nearly completely to pierce through the entire thickness of the porous silicon layer, thereby creating spike-like direct Ag—Si interconnections). The document Vinod et al. explicitly indicates that the firing step has to be performed at very high temperature (because "low temperature firing at 700° C. is not sufficient to wet and to etch completely the entire thickness of the porous silicon film"). Upon cooling, the Ag/Si layer recrystalizes so as to create the desired ohmic contact.

The step of forming the porous silicon is performed with constant process parameters (i.e., current density). Moreover, the recrystalization process (especially of an alloy like the Ag/Si layer) normally generates a homogeneous structure (for example, see B. Arzamasov, Material Science Edit, Mir Publisher Moscow, English translation 1989, chapter 4.3, page 91, ISBN 5-03-000074-7, the entire disclosure of which is herein incorporated by reference, wherein there is stated that "recrystallization is understood as the nucleation and growth of new grains with a smaller number of structural defect [sic]; recrystallization results in the formation of entirely new, most often equiaxed crystals" and that "as a rule, recrystallized alloy [sic] are homogeneous in their properties and exhibit no anisotropy"). Moreover, the high temperature to which the porous silicon is subject after its formation tends to reduce the superficial porosity (for example, see M. Banerjee et al., "Thermal annealing of porous silicon to develop a quasi monocrystalline structure", J Mater Sci: Mater Electron (2009) 20:305-311 DOI 10.1007/s10854-008-9725-y, the entire disclosure of which is herein incorporated by reference, wherein there is stated that after a thermal treatment "porous silicon was transformed into quasi monocrystalline porous silicon with a smooth surface and with few voids embedded inside the body").

Moreover, US-A-2009/0188553 (the entire disclosure of which is herein incorporated by reference) proposes using a porous silicon layer on the front surface to prevent recombination of the generated electric charges. Alternatively, the porous silicon layer may be used to getter impurities of the substrate; in this case, the substrate is annealed to diffuse the impurities into the porous silicon layer, which is then removed. The same document also suggests plating the front contact terminal on an adhesion-promoting porous silicon layer. For this purpose, grooves are made on the front surface; the porous silicon layer is then formed within the grooves, so as to provide an adhesion-promoting surface for the next plating of corresponding buried electrical contacts (with another porous silicon layer that may also be formed on the back surface, for its passivation followed by the opening of windows for contacting the substrate by a metallization layer that is deposited over this passivation layer). In another embodiment, a metallization layer is directly deposited on a porous silicon layer that is formed on the whole back surface; in this case, the front contact terminals are plated on corresponding electrical contact regions, which are obtained by selectively irradiating a photo-catalyst layer on which a hole-scavenger layer is applied. At the end, in a different embodiment the front contact terminals are formed by plating corresponding precursor electrical contacts; the precursor electrical contacts are formed on a porous silicon layer by a screen-printing and etching process. However, these techniques suffer from the same drawbacks pointed out above—i.e., the weakening of the mechanical structure being caused by the grooves (that requires the solar cell to be maintained relatively thick), and the high production costs being caused by the formation of the electrical contact regions or the precursor electrical contacts.

The porous silicon is also used in completely different applications. For example, in WO/2007/104799A1 (the entire disclosure of which is herein incorporated by reference) a porous silicon layer is formed on a substrate to facilitate the raising of leads being formed thereon, so as to obtain corresponding interconnection elements (after the substrate has been removed). For this purpose, the porous silicon layer is configured to allow the peeling of a portion of the leads from the substrate, but at the same time preventing their complete detachment; particularly, the porous silicon layer has a porosity that preferably decreases moving towards its portion to be raised. In any case, the porous silicon layer is relatively thick (for example, at least 2 μm), with a porosity that may also decrease moving inwards the substrate (with the resulting weakening of the substrate that it is not a problem, since it is generally removed after the formation of the raised leads).

In general terms, one or more embodiments are based on the idea of using the porous silicon to anchor the contact terminals on the substrate of the solar cells (or more generally, of the photovoltaic cells). Moreover, one or more embodiments are based on the idea of using a dynamic meniscus for implementing an electrolytic module or an etching module (which electrolytic module and/or etching module may also be used to implement a production line of the photovoltaic cells).

More specifically, an embodiment provides a photovoltaic cell (or solar cell) including a substrate of semiconductor material (for example, silicon). The photovoltaic cell includes a plurality of contact terminals; each contact terminal is arranged on a corresponding contact area of the substrate for collecting electric charges that are generated in the substrate by the light (for example, on a front surface and/or on a back surface of the substrate). For one or more of the contact areas the substrate includes at least one porous semiconductor region (for example, porous silicon), which extends from the contact area into the substrate for anchoring the whole corresponding contact terminal on the substrate. In an embodiment, each porous semiconductor region has a porosity decreasing moving away from the contact area inwards the substrate.

Another embodiment provides an etching module for performing an etching process on a substrate (for example, for processing these photovoltaic cells). The etching module includes an etching head. In turn, the etching head includes a support element having an operative surface. The etching head then includes one or more delivery mouths for delivering an etching solution on the operative surface. The etching head further includes one or more suction mouths (completely surrounding the delivery mouths on the operative surface) for sucking the delivered etching solution; in this way, there is formed a dynamic meniscus on the operative surface when in contact with a corresponding portion of the substrate.

Another embodiment provides an electrolytic module for performing an electrolytic process (for example, an anodization process or a deposition process) on a substrate (for example, for processing these photovoltaic cells). The electrolytic module includes a set of processing heads. In turn, each processing head includes a support element having an operative surface. The processing head then includes one or more delivery mouths for delivering a solution on the operative surface (with the support element that is made at least partially of an electrically conductive material for contacting the solution). The processing head further includes one or more suction mouths (arranged around the delivery mouths on the operative surface) for sucking the delivered solution; in this way, there is formed a dynamic meniscus on the operative surface when in contact with a corresponding portion of the substrate. One of the processing heads is an electrolytic head for providing a dynamic meniscus of an electrolytic solution. The electrolytic module further includes first biasing means for applying a first biasing voltage to the electrolytic solution through the electrolytic head, and second biasing means for applying a second biasing voltage to the substrate.

A further embodiment provides a production line for producing these photovoltaic cells. The production line includes an etching station; in turn, the etching station includes a set of etching modules as above, each one for clearing a corresponding portion of a contact area on each substrate currently in the etching station. In addition or in alternative, the production line also includes an anodization station; in turn, the anodization station includes a set of electrolytic modules as above, each one for forming a corresponding portion of a porous semiconductor region in the contact area of each substrate currently in the anodization station. In addition or in alternative, the production line further includes a deposition station; in turn, the deposition station includes a set of further electrolytic modules as above, each one for forming a corresponding portion of a contact terminal on the contact area of each substrate currently in the deposition station.

A different embodiment provides a process for producing a photovoltaic cell. Particularly, the process includes the step of providing a substrate of semiconductor material, which has a front surface for absorbing the light. At least one front contact terminal is then formed; the contact terminal is arranged on a front contact area of the front surface for collecting electric charges being generated in the substrate by the light. In an embodiment, the front contact area and the front contact terminal have a flat profile. The step of forming at least one front contact terminal includes forming at least one front porous semiconductor region, which extends from the front contact area into the substrate for anchoring the whole front contact terminal on the substrate. The process further includes chemically depositing the front contact terminal.

In an embodiment, the same steps may also be executed to form at least one back contact terminal on a back surface of the substrate (opposite its front surface).

BRIEF DESCRIPTION OF THE DRAWINGS

One or more embodiments, as well as features and the advantages thereof, will be best understood with reference to the following detailed description, given purely by way of a non-restrictive indication, to be read in conjunction with the accompanying drawings (wherein corresponding elements are denoted with equal or similar references and their explanation is not repeated for the sake of brevity). In this respect, it is expressly intended that the figures are not necessary drawn to scale (with some details that may be exaggerated and/or simplified) and that, unless otherwise indicated, they are merely used to conceptually illustrate the structures and procedures described herein. Particularly:

FIG. 6A-6B show an exemplary etching module that may be used to process the solar cell according to an embodiment in different operative conditions, FIG. 7A-7C show two exemplary anodization modules that may be used to process the solar cell according to corresponding embodiments in different operative conditions.

DETAILED DESCRIPTION

Figure 1:
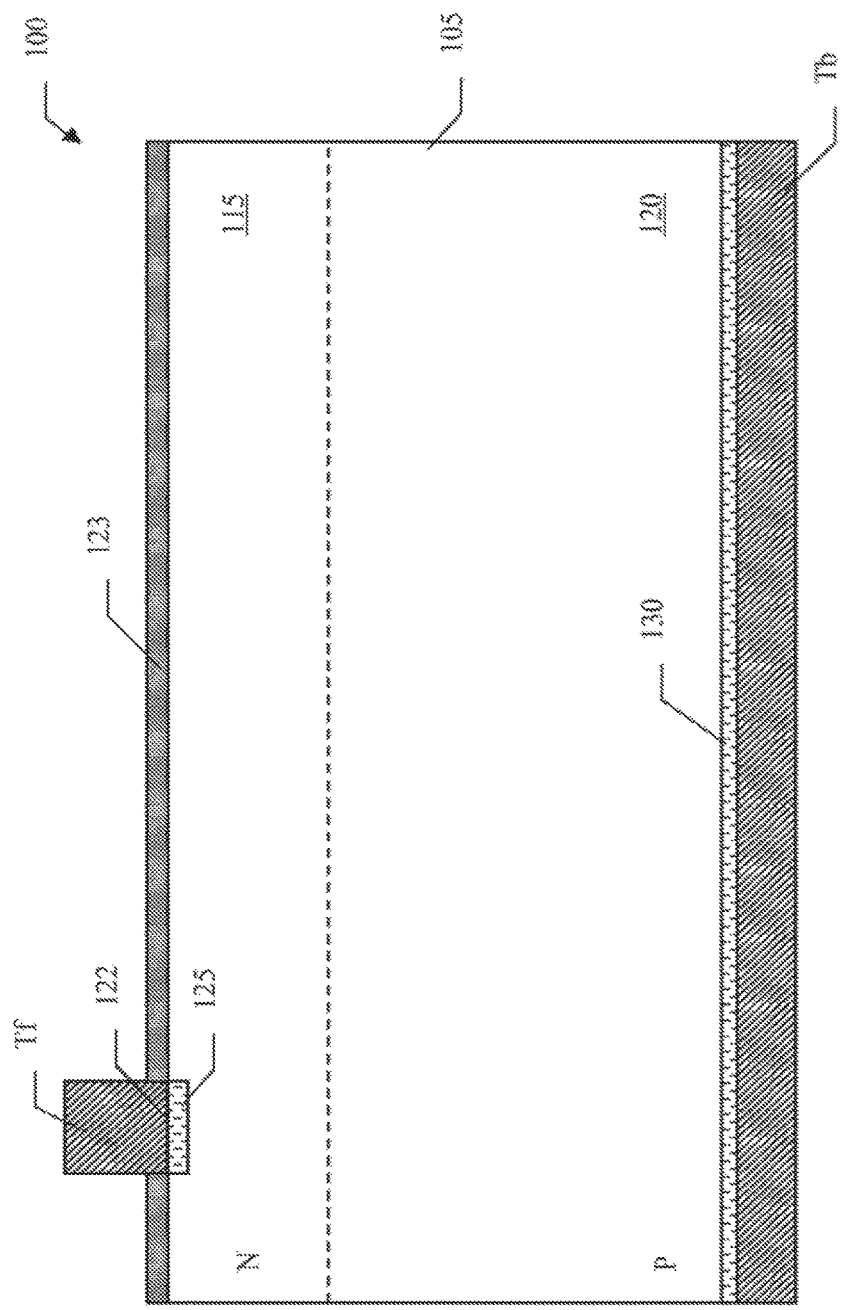
FIG. 1 shows a simplified cross-section view of a solar cell according to an embodiment.

With reference now to FIG. 1A, there is shown a simplified cross-section view of a solar cell 100 according to an embodiment.

Particularly, the solar cell 100 is made in a silicon substrate 105 (for example, with a size of 156 mm×156 mm). The substrate 105 has a front (upper) surface, which will be exposed to the sun light during operation of the solar cell 100, and a back (lower) surface opposite thereto. The substrate 105 includes an upper N-type layer 115 and a lower P-type layer 120, which form a (metallurgic) PN junction (with the front surface and the back surface of the substrate 105 that are defined by an exposed surface of the N-type layer 115 and by an exposed surface of the P-type layer 120, respectively).

A front contact terminal Tf (or more) and a back more contact terminal Tb (or more) are formed on the front surface and on the back surface, respectively, of the substrate 105 for collecting electric charges being generated in the substrate 105 by the sun light. Typically, the front contact terminal Tf extends on a small contact area 122 of the front surface of the substrate 105, which is exposed by a corresponding contact window being opened through a protective layer 123 of the substrate 105 (so as to limit the obscuring of its front surface to the sun light); for example, the front contact terminal Tf has a grid structure, with a plurality of narrow contact strips (extending throughout the whole solar cell—e.g., with a width of approximately 5-200 μm) that are coupled to a pair of larger contact strips, or buses (e.g., with a width of approximately 0.5-3 mm). Therefore, the front contact terminal Tf is relatively thick (for example, with a thickness of approximately 10-50 μm), in order to reduce the corresponding resistance (along the length of its contact strips and contact buses on the front surface of the substrate 105). On the contrary, the back contact terminal Tb typically extends throughout the whole back surface of the substrate 105 (in such case being not reached by the sun light in any case), without any constraint on its size and thickness.

In an embodiment, as described in detail in the following, a porous silicon region 125 (or more) extends from the contact area 122 in the substrate 105 (under the front contact terminal Tf).

The porous silicon region 125 strongly enhances an adhesion of the whole front contact terminal Tf on the contact area 122; therefore, the front contact terminal Tf is firmly anchored on the substrate 105, thereby warranting a stable contact resistance.

Moreover, it has been discovered, with great surprise, that in this way the front contact terminal Tf remains anchored on the front surface of the substrate 105 even if both of them are flat, irrespectively of the size and/or thickness of the front contact terminal Tf. As used hereinafter, the term flat means that the front surface of the substrate 105 does not have any groove for increasing the adhesion as in the prior art (with a width and/or a depth of the same order of magnitude as the size of the front contact terminal Tf—i.e., its width and height, respectively). Naturally, this does not exclude the possibility of having very small irregularities on the front surface of the substrate 105 (i.e., with a width and/or a depth at least one or two orders of magnitude lower than the size of the front contact terminal Tf); for example, this typically happens when the front surface of the substrate 105 is textured to reduce its reflection at the dominant wavelength of the sun light (for example, by an anisotropic etching process).

All of the above allows working a very thin substrate 105 for making the solar cell 100 (for example, with a thickness of approximately 20-100 μm), with a beneficial effect on its cost.

At the same time, the porous silicon region 125 also acts as a gettering center for impurities of the substrate 105 (for example, metals and oxygen); this increases the lifetime of the electrons and holes in the substrate 105. Therefore, the above-described embodiment has a beneficial effect on the lifetime of the light generated electric charges (i.e., electrons and holes) of the solar cell 100.

In addition or in alternative, a porous silicon region 130 (or more) may likewise extend from the back surface in the substrate 105 under the back contact terminal Tb. As above, the porous silicon region 130 strongly enhances an adhesion of the whole back contact terminal Tb, so that the back contact terminal Tb as well is firmly anchored on the substrate 105 (in addition to act as a gettering center for the impurities of the substrate 105).

In both cases, the increased adhesion being provided by the porous silicon regions 125, 130 allow making the front and/or back contact terminals Tf, Tb by means of a chemical (or wet) deposition process, with little or no risk of their detachment from the substrate 105 (so as to warrant a stable contact resistance). As a result, it is possible to reduce the temperatures to which the solar cell 100 is subject during its production process (for example, working at room temperature, or in any case below approximately 300-350° C.), so as to avoid, or at least strongly reduce, any mechanical stresses on the solar cell 100 (being due to the different thermal expansion coefficients of its materials). This further reduces the production cost of the solar cell 100, and significantly reduces the resistance of the contact terminals Tf, Tb with a corresponding improvement of the efficiency of the solar cell 100.

With reference now to FIG. 2A-2H, there are shown the main stages of a process for producing this solar cell according to an embodiment.

Figure 2A:
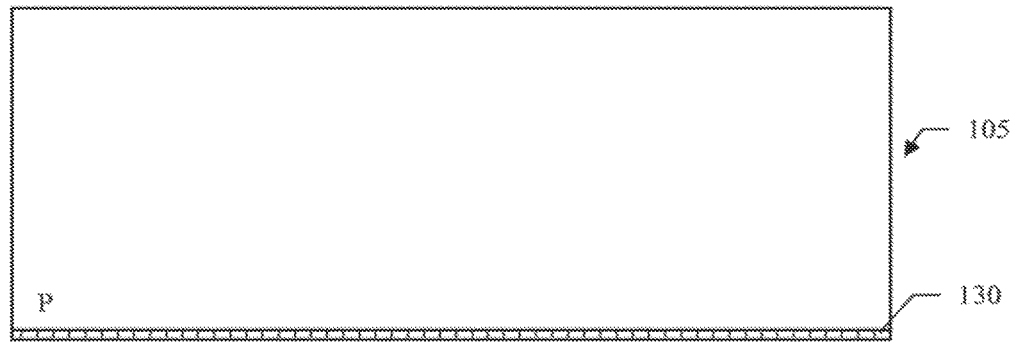
FIG. 2A-2H show the main stages of a process for producing a solar cell according to an embodiment.

As shown in the example of FIG. 2A, the production process starts with a silicon wafer (of mono-crystalline or poly-crystalline type) that defines the substrate 105 of the solar cell; the wafer 105 is of the P-type of conductivity (for example, with a resistivity of approximately 1-3 Ω·cm). Optionally, a highly doped P-type contact layer (not shown in the figure) may also be formed extending from the back surface in the wafer 105 (in order to provide a good ohmic contact with the corresponding back contact terminal). The porous silicon region 130 is made extending from the back surface into the wafer 105—for example, throughout its whole extent with a depth of approximately 0.05-1 μm (such as approximately 0.3 μm). For this purpose, the wafer 105 is subject to an anodic process (described in detail in the following), wherein the wafer 105 is used as an anode in an electrolytic cell (at a positive voltage with respect to a negative voltage of a cathode thereof).

Figure 2B:
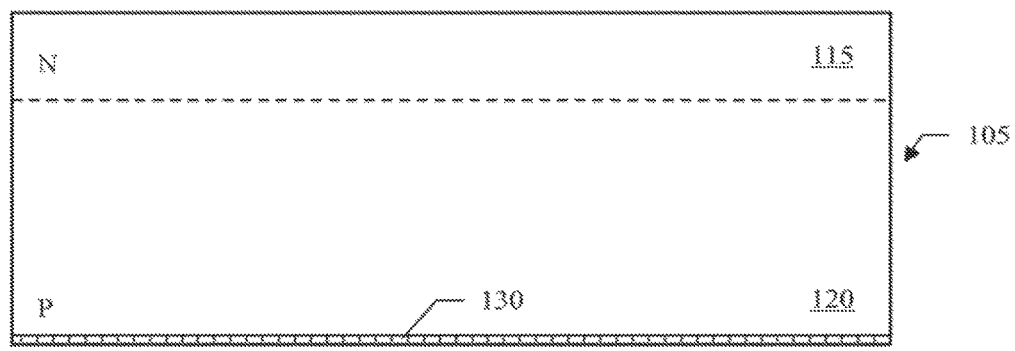

The production process continues to FIG. 2B, wherein the N-type layer 115 is made extending from the front surface into the wafer 105 (for example, by a diffusion or implantation process); in this way, a remaining portion of the wafer 105 defines the P-type layer 120 (which forms the desired PN junction with the N-type layer 115, being buried in the wafer 105 proximate to its front surface). For example, the N-type layer 115 has a depth of approximately 0.2-1.5 μm (such as approximately 0.3-0.7 μm). The doping concentration of the N-type layer 115 has a Gaussian profile, which decreases from a peak at the front surface of the wafer 105 until reaching the same value of the P-type layer 120 at their interface. For example, the peak doping concentration of the N-type layer 115 is of approximately $5 \cdot 10^{19}$-$2 \cdot 10^{20}$ atoms/$cm^3$. Otherwise, when the doping concentration of the N-type layer 115 is lower than approximately $1 \cdot 10^{19}$ atoms/$cm^3$, one or more highly doped N-type contact regions (not shown in the figure) may be formed extending from the front surface into the wafer 105 (in correspondence to the front contact terminal, in order to provide a good ohmic contact therewith); for example, these N-type contact regions have a depth of approximately 2-3 μm, and a peak doping concentration (starting from the front surface of the wafer 105) of approximately $1 \cdot 10^{20}$-$1 \cdot 10^{21}$ atoms/$cm^3$.

Figure 2C:
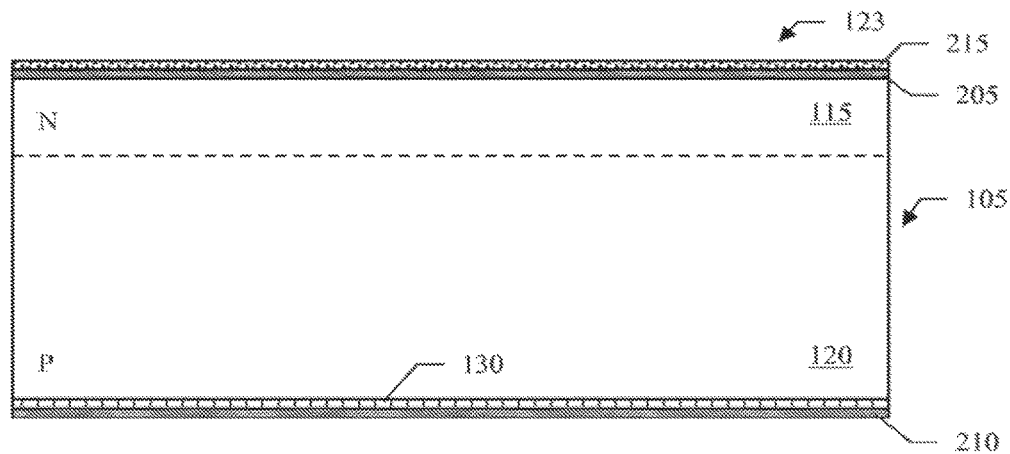

With reference to FIG. 2C, during the diffusion process of the N-type layer 115 a thin oxide layer 205 and a thin oxide layer 210 form on the front surface and on the back surface, respectively, of the wafer 105. An anti-reflection coating 215 is then applied on the oxide layer 205 (with the oxide layer 210 and the anti-reflection coating 215 that form the protective layer 123 of the front surface of the wafer 105); for example, the anti-reflection coating 215 is made of silicon nitride ($Si_3N_4$), which is usually deposited by a plasma enhanced chemical vapour deposition (PECVD) process. The oxide layer 210 on the back surface of the wafer 105 is then removed—for example, by immersing the wafer 105 into a buffered Hydrofluoric (HF) acid solution.

Figure 2D:
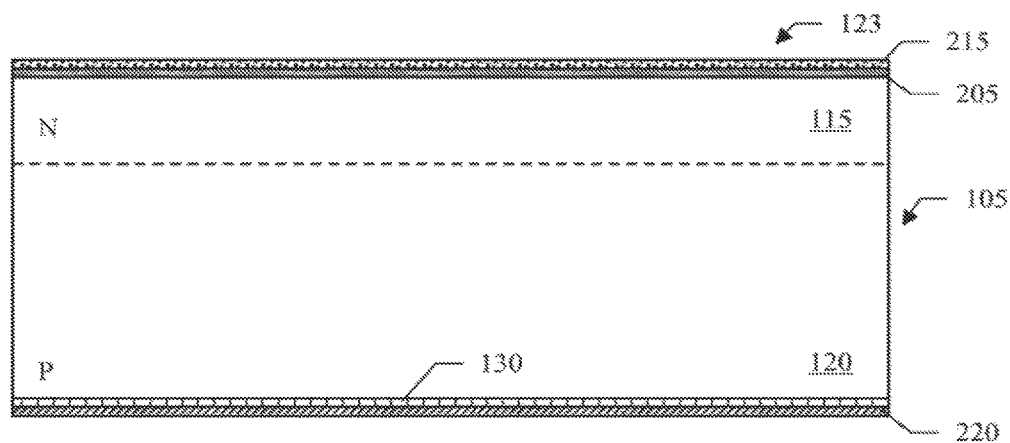

Proceeding to FIG. 2D, a thin metal layer 220 is made on the back surface of the wafer 105 (i.e., on the porous silicon region 130) by an electro-less deposition process; for example, the thin metal layer 220 is made of Nichel (Ni), with a thickness of 0.1-2 μm.

Figure 2E:
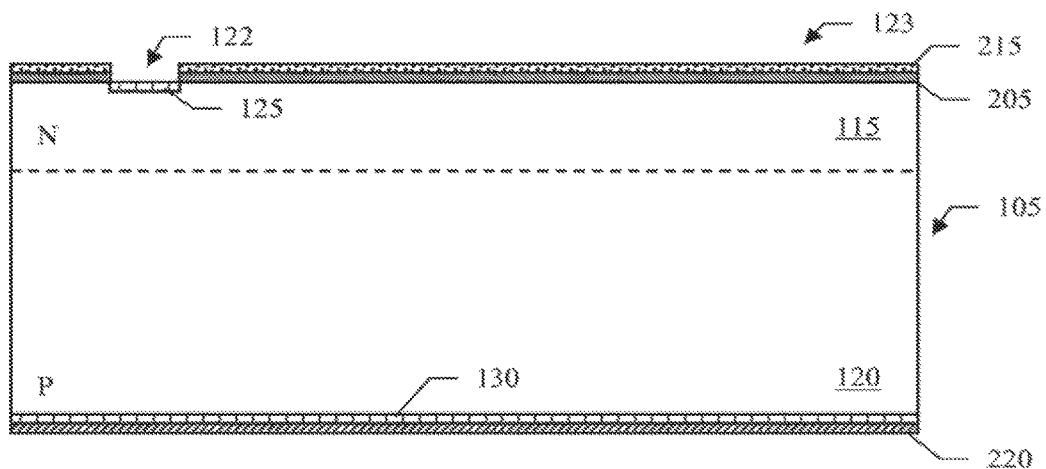

As shown in FIG. 2E, the contact window for the front contact terminal is opened in the protective layer 123 (i.e., the oxide layer 205 and the anti-reflection coating 215); for example, this contact window is made by a standard photo-lithographic process (wherein a photo-resist layer is patterned photo-lithographically to obtain a corresponding photo-resist mask, with the anti-reflection coating 215 and the oxide layer 205 being not protected by the photo-resist mask that are then etched—for example, through a dry or wet etching process). The contact window exposes the corresponding contact area 122 of the front surface of the wafer 105, with the possible N-type contact region (not shown in the figure).

In the contact area 122, the porous silicon region 125 is then made extending from the front surface into the wafer 105—for example, with a depth of approximately 0.05-1 μm (such as approximately 0.2 μm). For this purpose, the wafer 105 is again subject to an anodic process (described in detail in the following), wherein the wafer 105 is used as an anode (at a positive voltage) in an electrolytic cell (with an electrolytic solution that does not damage the anti-reflection coating 215 or with a photo-resist mask, not shown in the figure, which protects the anti-reflection coating 215); in this respect, it is noted that the positive voltage that is applied to the back surface of the wafer 105 forward biases the PN junction 120-115, so that is does not interfere with the anodic process.

Figure 2F:
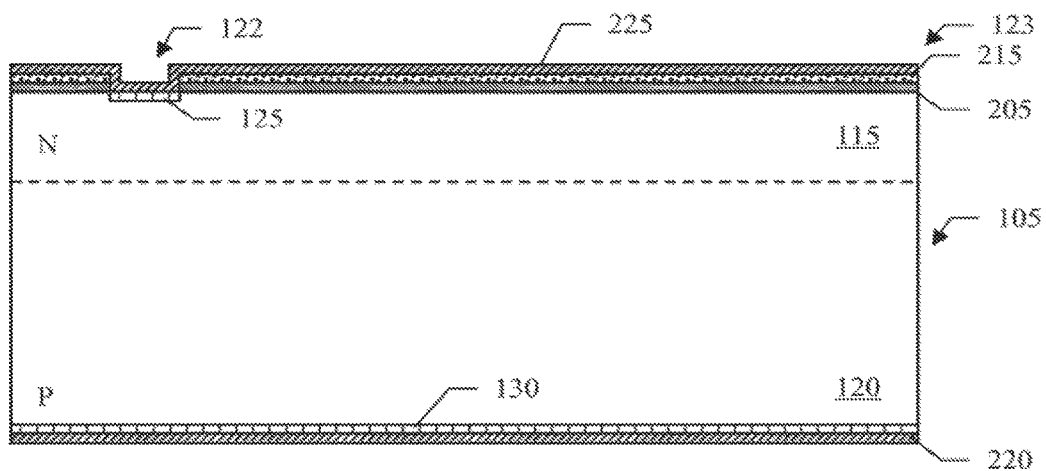

Moving to FIG. 2F, a thin metal layer 225 is made on the front surface of the wafer 105 (i.e., on the porous silicon region 125 and on the anti-reflection coating 215, after removing its possible protection mask) by an electro-less deposition process; for example, as above the thin metal layer 225 is made of Nickel, with a thickness of approximately 0.1-1 μm. Optionally, the wafer 105 may now be subject to a rapid thermal annealing process to form a Nickel Silicide (Ni$_2$Si) layer at the interface between the porous silicon layer 130 and the thin metal layer 220, and at the interface between the porous silicon region 125 and the thin metal layer 225 (in order to reduce a corresponding contact resistance); this annealing process is performed at relatively low temperature, usually below approximately 350° C., and for a short period (for example, at approximately 200° C. for approximately 60 s).

Figure 2G:
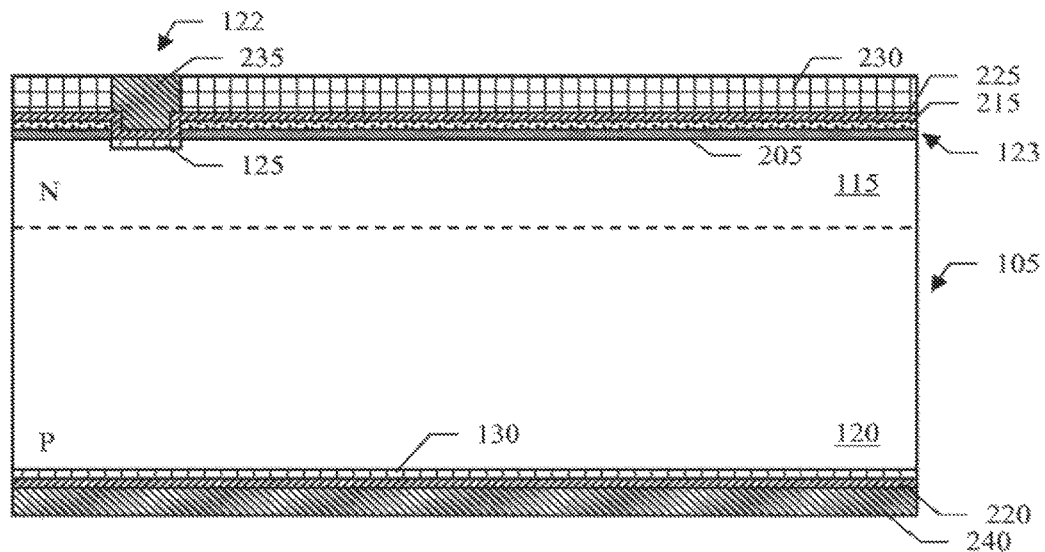

The production process continues to FIG. 2G, wherein a photo-resist mask 230 is made on the thin metal layer 225, so as to leave exposed it in correspondence to the contact window on the front surface of the wafer 105 (for example, by a standard photo-lithographic process). A thick metal track 235 is made on the thin metal layer 225 being exposed by the photo-resist mask 230 (i.e., on the contact window), and a thick metal layer 240 is made on the thin metal layer 220 by an electrolytic deposition process (with the required biasing voltage that is applied to the wafer 150 through the thin metal layers 220 and 225); for example, the thick metal track 235 and the thick metal layer 240 are made of Copper (Cu), with a thickness of approximately 5-50 μm. The photo-resist mask 230 is then stripped.

Figure 2H:
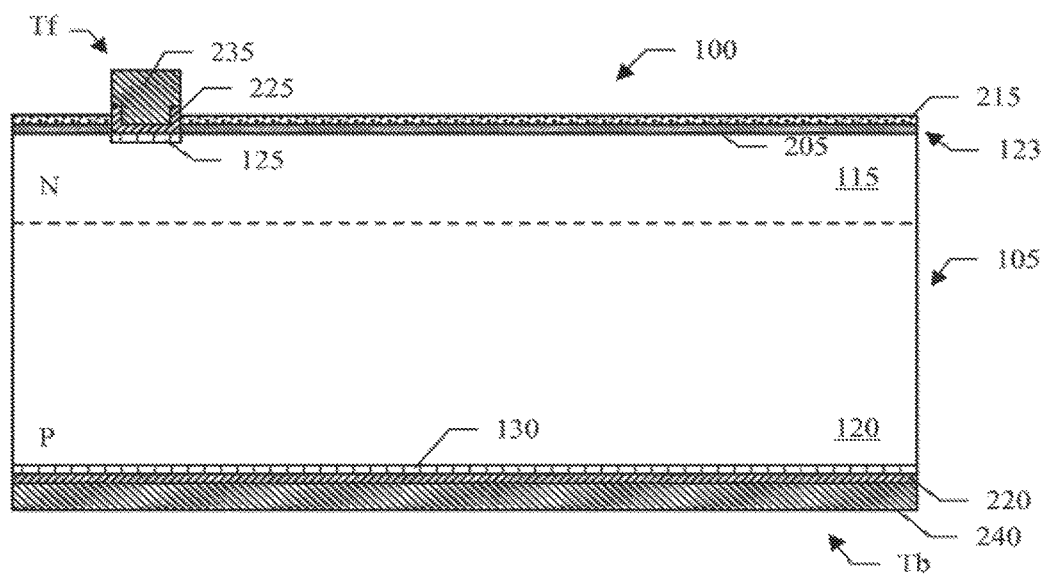

With reference now to FIG. 2H, the front surface of the wafer 105 is subject to a dry or wet etching process, until the thin metal layer 225 being not protected by the thick metal track 235 is removed, thereby exposing the anti-reflection coating 215 (for example, by a dry or wet etching process wherein the thick metal track 235 acts as a mask). In this way, there is obtained the desired solar cell 100. Particularly, the remaining portion of the thin metal layer 225 and the thick metal track 235 on top of it define the front contact terminal Tf; likewise, the thin metal layer 220 and the thick metal layer 240 on top of it define the back contact terminal Tb.

The above-described electrolytic deposition process allows obtaining very thick front and back contact terminals Tf, Tb in a relatively short time (with a consequent reduction of the production cost of the solar cell 100). In this respect, it should be noted that in a conventional electrolytic cell (being used to perform the above-mentioned electrolytic deposition processes) the wafer 105 is used as a cathode. Therefore, the corresponding negative voltage being required to bias the wafer 105 cannot be applied to its back surface to form the thick metal track 235 of the front contact terminal Tf (since the PN junction 120-115 would be reverse biased thereby acting as a blocking contact); for this reason, the thin metal layer 225 is previously made on the front surface of the wafer 105 by an electro-less deposition process, so as to allow applying the required negative voltage thereto.

Figure 3A:
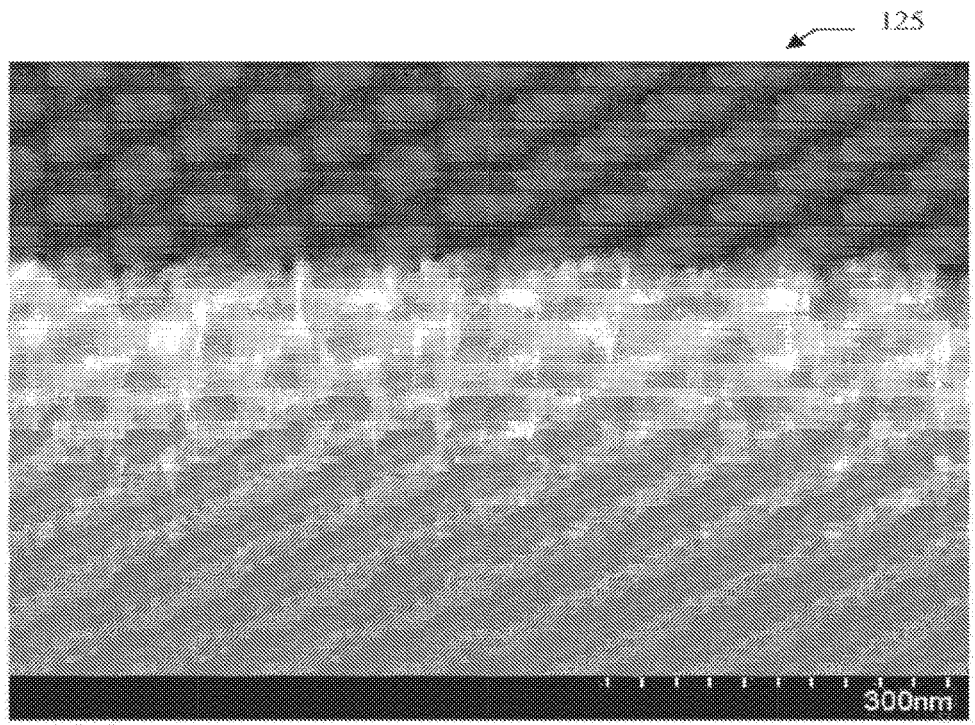
FIG. 3A shows a scanning electron microscopy photo of a porous silicon region according to an embodiment.
Figure 3B:
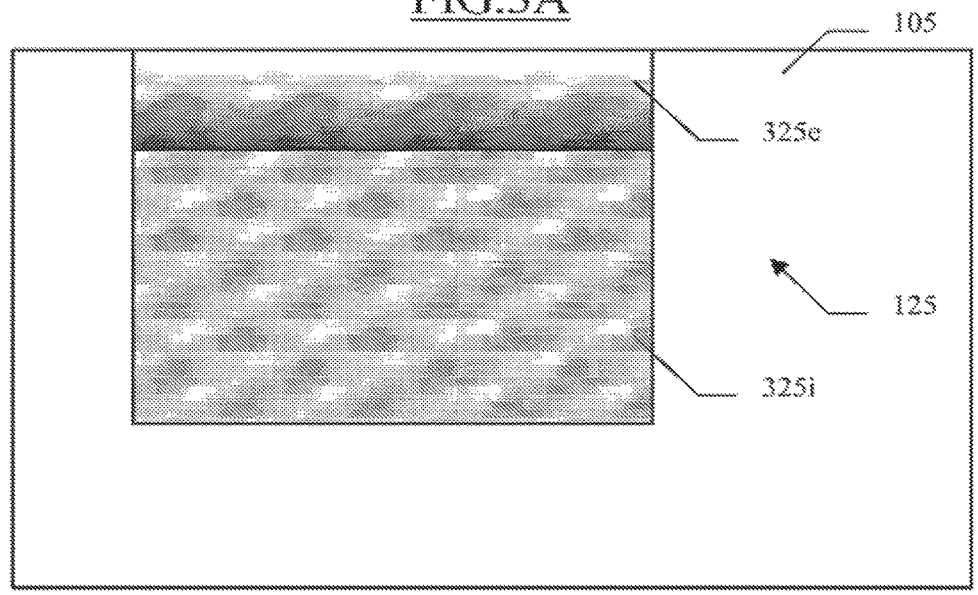
FIG. 3B shows a schematic cross-section view of a porous silicon region according to another embodiment.

Moving now to FIG. 3A-FIG. 3B, different techniques may be used to make each porous silicon region (either on the front surface or on the back surface of the wafer). For example, in an embodiment the porous silicon region is obtained by an anodic process (wherein the wafer is used as an anode in an electrolytic cell including an electrolytic solution being rich of HF acid). When a current density of the anodic process is lower than a critical value J$_{PS}$ (depending on multiple experimental factors), the electrolytic solution only reacts with holes that reach the exposed surface of the wafer (so that the reaction is limited by the feeding of the holes and not by their ionic diffusion into the electrolytic solution). Of course, this requires the availability of (free) holes at the exposed surface of the wafer. When the porous silicon region is made on the back surface of the wafer, the holes are obviously available in the corresponding P-type layer. Conversely, when the porous silicon region is made on the front surface of the wafer, the interface between the corresponding N-type layer and the electrolytic solution acts as a reverse-biased Schottkly junction (i.e., with a depletion region whose width decreases as the concentration of impurities in the N-type layer increases). Therefore, when the N-type layer has a high concentration of impurities (i.e., at least approximately $1·10^{17}$ atoms/cm$^3$), the free holes in the N-type layer can pass through the potential barrier of this junction by quantum-mechanical tunneling; conversely, it is necessary to provide energy to the holes for allowing their passage through the potential barrier—for example, by lighting the wafer on its front and/or back surface. This means that if the anodic process is performed in a dark condition (for example, below approximately 0.2-2 lux, such as below approximately 1 lux), the porous silicon region can only be obtained in the external portion of the N-type layer having a doping concentration at least equal to approximately $1·10^{17}$ atoms/cm$^3$. Therefore, the doping concentration profile of the N-type layer may be used to control the depth of the porous silicon region in a very simple and accurate way; for this purpose, it is enough to provide the external portion of the N-type layer with this doping concentration for the desired thickness of the porous silicon region, and a remaining portion of the N-type layer with a lower doping concentration (so that the anodic process will stop automatically after the conversion of the whole external portion of the N-type layer into porous silicon). In any case (i.e., when a lower depth is desired, when the N-type layer has a higher doping concentration, or when the wafer is illuminated) the depth of the porous silicon region can be controlled by varying the length of the anodic process.

The porous silicon so obtained has a complex structure with a random network of small pores. The characteristics of the porous silicon depend on its morphology, which in turn is a function of a regime of the anodic process being defined by different parameters (for example, the length, the concentration and the type of impurities of the silicon, the current density, the type of electrolytic solution, and the like). In this context, the relevant characteristic of the porous silicon is its porosity (P$_{PS}$%), which is defined with respect to the (compact) silicon as:

$$P_{PS}\ \% = \left(1 - \frac{\rho_{PS}}{\rho_{Si}}\right)\%$$

where $\rho_{PS}$ is the density of the porous silicon and $\rho_{Si}$ is the density of the compact silicon (i.e., approximately 2.3 g/cm$^3$). The density of the porous silicon $\rho_{PS}$ can be measured by applying the following formula:

$$\rho_{PS} = \rho_{Si} - \frac{P_{Si} - P_e}{S \cdot d_{PS}}$$

where the values P$_{Si}$ (initial weight of the wafer before the anodic process), P$_e$ (ending weight of the wafer after the anodic process) and d$_{PS}$ (thickness of the porous silicon region) can be measured, while the value S (extent of the exposed surface of the wafer being subject to the anodic process) is known. Particularly, the porosity increases with the doping concentration of N-type, and it decreases with the doping concentration of P-type. Moreover, the porosity increases as the current density increases (above a minimum value), and/or as the electrolytic solution concentration decreases.

The porosity of the porous silicon region is selected as a trade-off between the opposed requirements of good adhesion (high porosity) and good mechanical stability (low porosity). For example, in an embodiment the porosity of the porous silicon region is in the approximate range $P_{PS}\%=20\%-80\%$, and for example $P_{PS}\%=$approximately 30%-70%, such as $P_{PS}\%=$approximately 50%. In any case, the porous silicon region should be maintained relatively thin; for example, in an embodiment the porous silicon region has a thickness lower than approximately 1 μm, and for example lower than approximately 0.5 μm, such as approximately 0.2 μm. Indeed, in this way the metal of the contact terminal being formed thereon penetrates inside the pores of the whole porous silicon region, thereby consolidating its structure so as to avoid any mechanical stability problem and to warrant a stable contact resistance.

For example, in each contact area there is formed a single porous silicon region that extends on its whole surface (with a uniform porosity throughout it); this provides the best adhesion of the corresponding contact terminal in a very simple way.

Alternatively, multiple porous silicon regions may be formed in each contact area. The porous silicon regions (with any shape—for example, rectangular, squared or circular) are distributed uniformly throughout the contact area. The concentration of the porous silicon regions in the contact area determines its (average) force of adhesion as a whole. For example, a single porous region with a size of approximately 10 mm² (being made of a porous silicon that provides an adhesion of approximately 20 MPa) generates a force of adhesion of approximately $(20 \cdot 10^6) \cdot (10 \cdot 10^{-6}) = 200$N; the same result is achieved with 5 porous regions with a size of approximately 1 mm² being made of a porous silicon that provides an adhesion of approximately 40 Mpa, which again generate a force of adhesion of approximately $(40 \cdot 10^6) \cdot (5 \cdot 1 \cdot 10^{-6}) = 200$N. In this way, it is possible to alternate the effect of the porous silicon regions (increasing the adhesion but reducing the mechanical stability) with the one of the compact silicon (maintaining the mechanical stability).

In another embodiment, the adhesion of the porous silicon regions decreases (on the contact area) by moving inwards from a border thereof. For example, the adhesion decreases from a maximum value (at the border of the contact area) to a minimum value (at the center of the contact area) equal to approximately 10%-50%, and for example equal to approximately 20%-40%, such as equal to approximately 25%-35% of the maximum value. For example, the adhesion at the border of the contact area may be about 150-250 MPa, while the adhesion at the center of the contact area may be approximately 60-90 MPa. The desired result is achieved by reducing the concentration (i.e., the number and/or the size) of the porous silicon regions while moving from the border to the center of the contact area. In this way, it is possible to have a high adhesion where the risk of detachment of the contact terminal is the highest (i.e., at its border), and at the same time to guarantee a high mechanical stability (by reducing the porous silicon where the risk of detachment of the contact terminal is the lowest—i.e., at its center).

As a further improvement, the porosity of the porous silicon region is modulated by decreasing it moving away from the corresponding contact area. In this way, it is possible to have a higher porosity on the contact area (so as to increase the adhesion of the corresponding contact terminal) and a lower porosity inside the wafer (so as to guarantee its mechanical stability). Particularly, the porosity on the contact area may also be set to very high values that would make the wafer mechanically unstable; indeed, the metal of the contact terminal being formed thereon that penetrates inside the pores of the porous silicon region consolidates its structure (at the same time of anchoring the contact terminal to the wafer). In this way, it is possible to obtain a very high adhesion with a good mechanical stability warranting a stable contact resistance. For example, the porosity decreases from $P_{PS}\%=$approximately 70%-90% (such as $P_{PS}\%=$approximately 75%-85%, like $P_{PS}\%=$approximately 80%) at the contact area to $P_{PS}\%=$approximately 10%-30% (such as $P_{PS}\%=$approximately 15%-25%, like $P_{PS}\%=$approximately 20%) at its maximum depth. Such result may be obtained by varying the process parameters accordingly (for example, by decreasing the current density over time with a linear law).

Particularly, an electron microscopy photo of an exemplary porous silicon region 125 that was made on the front surface of the wafer is shown in FIG. 3A (similar considerations apply to the porous silicon layer on the back surface of the wafer). The porous silicon region 125 (wherein higher porosity zones at the top are lighter and lower porosity zones at the bottom are darker) was obtained with a concentration of the electrolytic solution equal to approximately 9% in volume of HF, by varying the current density from approximately 150 mA/cm² to approximately 15 mA/cm² in approximately 6 s; the porous silicon region 125 has a porosity varying from $P_{PS}\%=$approximately 80% to $P_{PS}\%=$approximately 30%. This porous silicon region 125 provided an adhesion higher than approximately 210 MPa of the front contact terminal made of approximately 0.25 μm of Nickel and approximately 20 μm of Copper. As another example, a further porous silicon region was obtained with a concentration of the electrolytic solution equal to approximately 25% in volume of HF, by varying the current density from approximately 120 mA/cm² to approximately 10 mA/cm² in approximately 6 s; the obtained porous silicon region has a porosity varying from $P_{PS}\%=$approximately 80% to $P_{PS}\%=$approximately 50%. This porous silicon (being used on the back surface of the wafer) provided an adhesion higher than approximately 40-50 MPa of the back contact terminal made of approximately 0.4 μm of Nickel and approximately 15 μm of Copper. In both cases, the (front and back) contact terminals withstood the standard tape test; moreover, the contact terminals did not lift off after heating the wafer up to approximately 600° C., or even after subjecting it to a thermal shock from approximately −70° C. to 200° C.

Optionally, as shown in the schematic cross-section view of FIG. 3B, the porous silicon region 125 on the front surface of the wafer 105 (similar considerations apply to the porous silicon layer on the back surface of the wafer 105) may include, in addition to an external layer 325e with modulated porosity as above, an internal layer 325i with uniform porosity. The internal layer 325i has a porosity that is may be between the maximum porosity and the minimum porosity of the external layer 325e (for example, $P_{PS}\%=$approximately 20-40%, and for example $P_{PS}\%=$approximately 25-35%, such as $P_{PS}\%=$approximately 20% for an external layer with a porosity in the range from $P_{PS}\%=$approximately 80% to $P_{PS}\%=$approximately 20%). For example, this result may be achieved with an anodization process at constant process parameters (for forming the internal layer 325i) immediately after the anodization process with variable process parameters as above (for forming the external layer 325e). For example, the internal layer 325i is thicker than the external layer 325e (e.g., with a thickness equal to approximately 1-6 times, and for example equal to approximately 1.5-2.5 times the one of the external layer 325e); for example, in a porous silicon region 125 with a thickness of approximately 0.75 µm, the external layer 325e may be of approximately 0.25 µm and the internal layer 325i may be of approximately 0.5 µm. The internal layer 325i emphasizes the gettering effect of the porous silicon region 125.

Figure 4A:
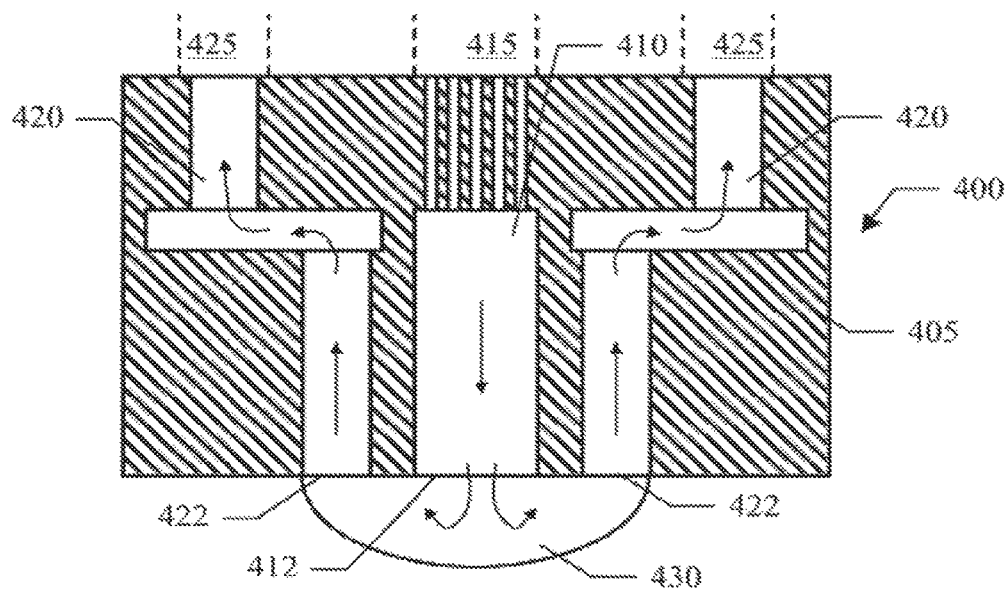
FIG. 4A-FIG. 4B show a simplified cross-section view and bottom view, respectively, of a processing head that may be used to process the solar cell according to an embodiment.
Figure 4B:
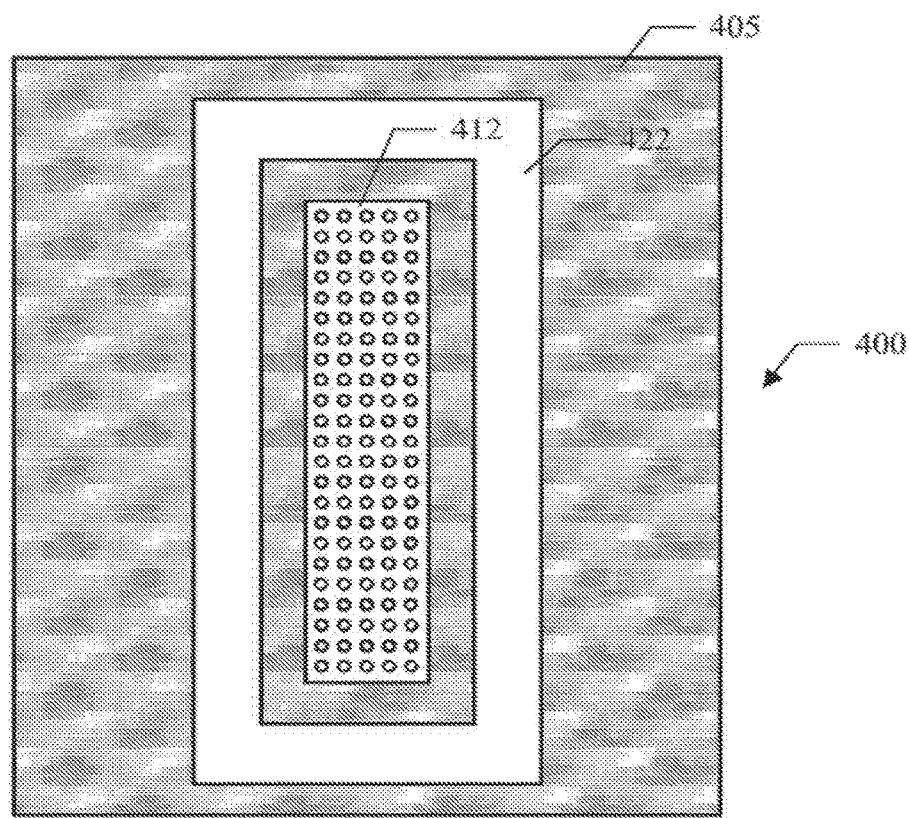

With reference now to FIG. 4A-FIG. 4B together, there is shown a simplified cross-section view and a simplified bottom view, respectively, of a processing head 400 that can be used to process the solar cell according to an embodiment.

Particularly, the processing head 400 is formed in a silicon substrate 405. A delivery duct 410 crosses the silicon substrate 405 from an upper surface thereof to a lower surface thereof; the delivery duct 410 ends with a corresponding delivery mouth 412 on the lower surface of the substrate 405. A delivery pump 415 is coupled to the delivery duct 410 on the upper surface of the silicon substrate 405. A suction duct 420 likewise crosses the silicon substrate 405 from its upper surface to its lower surface. The suction duct 420 ends with a corresponding suction mouth 422 on the lower surface of the substrate 405; the suction mouth 422 has a frame-like shape (for example, with a width of approximately 10-200 µm), which is arranged around the delivery mouth 412 so as to totally surround it (for example, at a distance of approximately 1-250 µm). A suction pump 425 (of the vacuum type with a regulation valve) is coupled to the suction duct 420 on the upper surface of the silicon substrate 405 (for example, through a lung system).

In operation, the delivery pump 415 pumps a generic chemical solution into the delivery duct 410. The chemical solution is then delivered by the delivery mouth 412 on the lower surface of the silicon substrate 405. At the same time, the suction pump 425 creates a depression in the suction duct 420. The depression at the suction month 422 around the delivery mouth 412 immediately sucks back the chemical solution being delivered by the delivery mouth 412 (without being loosen by the processing head 400), as shown by the arrows in the figure. As a result, a dynamic drop 430 is formed on the lower surface of the silicon substrate 405 by the chemical solution (in correspondence to the delivery mouth 412 and the suction mouth 422)—which dynamic drop 430 will be transformed into a dynamic meniscus when in contact with an underlying surface. Particularly, this dynamic drop 430 is formed by a portion of the chemical solution that remains attached under the silicon substrate 405; the dynamic drop 430 is in a fixed position, but its content is continuously refreshed (thanks to the flow of the chemical solution from the delivery duct 410 to the suction duct 420). The size of the dynamic drop 430 may be controlled dynamically (by corresponding control means, not shown in the figure) by changing the inflow of the chemical solution that is delivered by the delivery duct 410 (through the delivery pump 415) and/or the depression at the suction duct 420 (through the suction pump 425), and/or it may be controlled statically by setting the distance and the sizes of the suction mouth 422 and the delivery mouth 412.

Figure 4C:
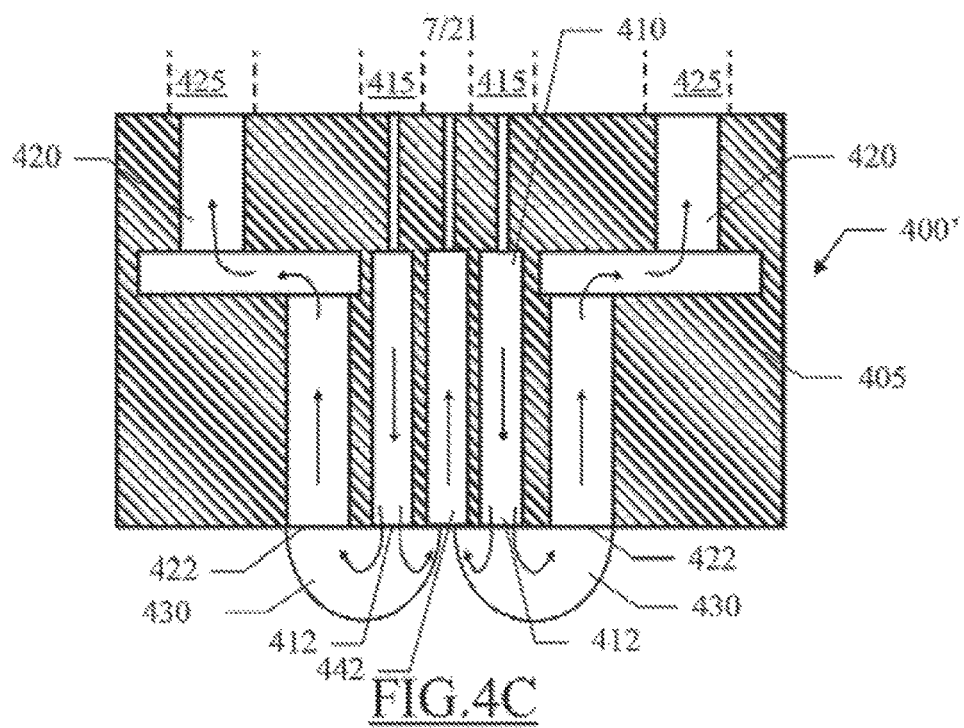
FIG. 4C-FIG. 4D show a simplified cross-section view and bottom view, respectively, of a processing head that may be used to process the solar cell according to a further embodiment.
Figure 4D:
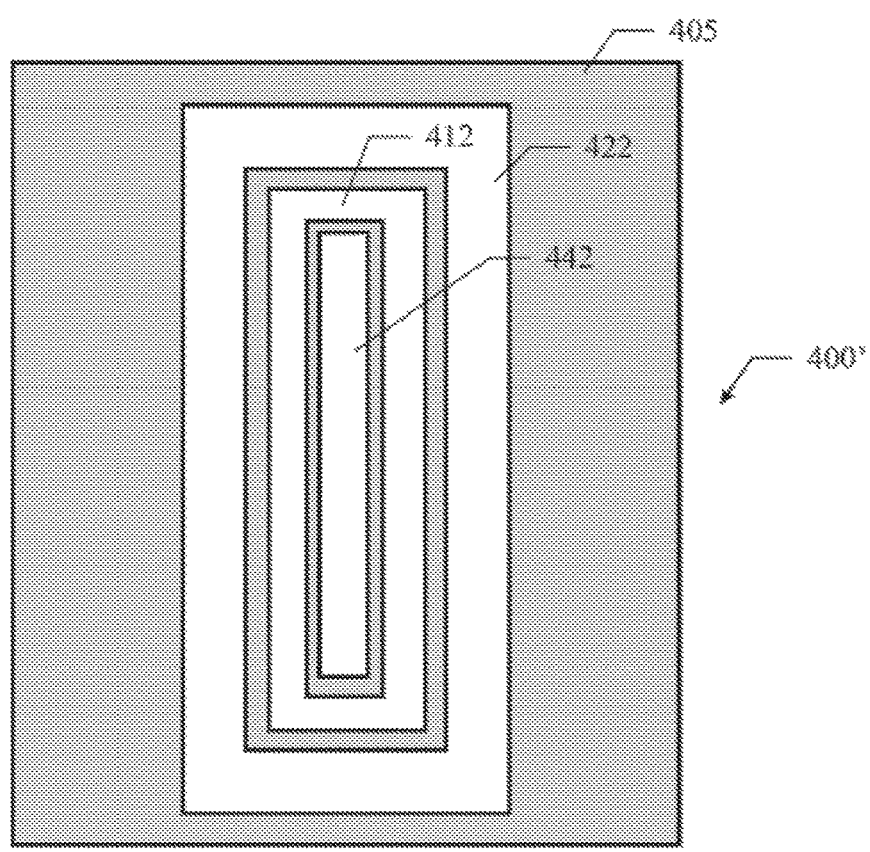

With reference now to FIG. 4C-FIG. 4D together, there is shown a simplified cross-section view and simplified bottom view, respectively, of a processing head 400' that can be used to process the solar cell according to a further embodiment of the invention.

In this case, a further suction mouth 442 is added inside the delivery mouth 412 (so as to create an empty region inside the resulting dynamic meniscus).

Figure 5A:
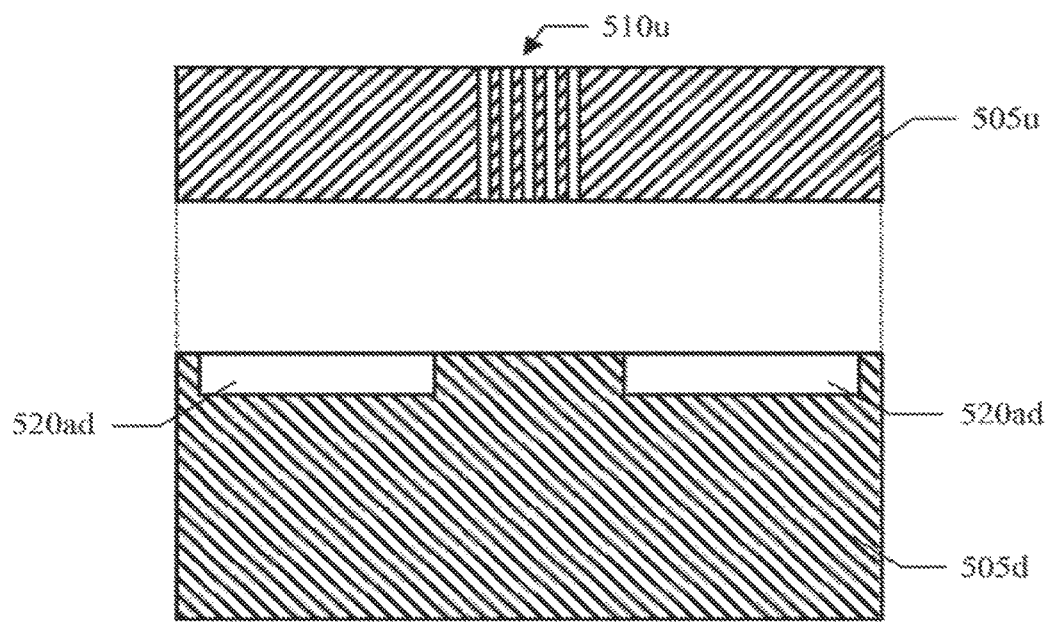
FIG. 5A-5B show the main stages of a process for producing the processing head of FIG. 4A-FIG. 4B according to an embodiment.
Figure 5B:
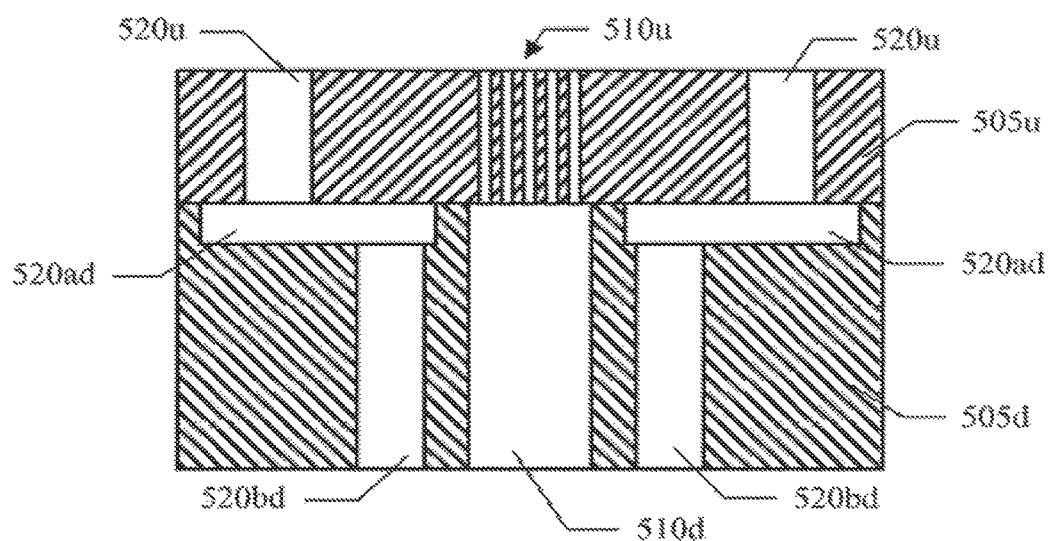

Moving to FIG. 5A-5B, there are shown the main stages of a process for producing this processing head according to an embodiment.

As shown in FIG. 5A, the production process starts with two silicon wafers 505u and 505d with either the same or different type of conductivity of the N-type or of the P-type (for example, with a resistivity of approximately 0.001-200 Ω·cm). One or more small through-holes 510u are made across the (upper) wafer 505u (between an upper surface and a lower surface thereof); for example, the through-holes 510u are made by a Deep Reactive Ion Etching (DRIE) process, which allows obtaining through-holes 510u of circular section with a diameter down to approximately 10 µm and a depth up to approximately 750 µm. At the same time, a trench 520ad is made extending into the (lower) wafer 505d from an upper surface thereof (for example, by a wet etching or plasma etching process).

Moving to FIG. 5B, the wafers 505u and 505d are superimposed (with the lower surface of the wafer 505u in contact with the upper surface of the wafer 505d) and aligned to each other; the wafers 505u and 505d are then bonded together (for example, by a silicon fusion bonding process). At this point, a through-hole 510d is made across the wafer 505d (between a lower surface thereof and its upper surface); in plan view, the through-hole 510d embeds all the through-holes 510u (inside the trench 520ad), so as to reach them. Moreover, a trench 520bd is made extending into the wafer 505d from its lower surface (for example, by the DRIE process); the trench 520bd extends in plan view along a frame that surrounds the through-hole 510d, so as to reach the trench 520ad in proximity of its inner edge; likewise, a trench 520u is made extending into the wafer 505u from its upper surface (for example, by the DRIE process), so as to reach the trench 520ad in proximity of its outer edge. In this way, the through-holes 510u and the through-hole 510d define the delivery duct of the processing head, while the trenches 520u, 520ad and 520bd define its suction duct. The processing head is then completed by connecting the delivery pump and the suction pump (not shown in the figure) to the through-holes 510u and to the trench 520u, respectively, on the upper surface of the wafer 505u; for this purpose, corresponding piping connections are sealed to the wafer 505u (for example, by a soldering or eutectic process—such as based on gold-silicon).

The above-described structure may be produced in a very simple way. Indeed, in this case the different components of the processing head may be formed by crossing separate wafers (with a reduced thickness); at the same time, the wafers may be bonded together without too stringent accuracy requirements.

The above-described processing head may also be made in polymeric material (such as Polyvinylidene fluoride, or PVDF). For example, this result may be achieved by using the above-described technology to make a silicon sacrificial insert with a negative structure with respect to the one of the FIG. 5B. More specifically, when the two silicon wafers are still separated, small through-holes are made across the upper wafer among the areas where the through-holes 510u are to be formed, and a large through-hole (with a frame section) is made across the lower wafer between the areas where the through-hole 510d and the trench 520bd are to be formed. After the two wafers have been bonded, silicon is removed from the upper wafer between the areas where the through-holes 510u and the trench 520u are to be formed, and around the area where the same trench 520*u* is to be formed; moreover, silicon is removed from the lower wafer around the area where the trench 520*bd* is to be formed, down to reach the area where the trench 520*ad* is to be formed. The sacrificial insert so obtained is now placed into a stamp for injection molding, which is brought to a temperature higher than a melting temperature of the polymeric material to be injected (such as approximately 175-200° C. for the PVDF). At this point, the polymeric material is injected under pressure into the stamp, so as to fill all the openings of the sacrificial insert (corresponding to the desired processing head). The stamp is cooled down to room temperature, and the structure so obtained is extracted. The sacrificial insert is then removed (by means of an etching process selective to the polymeric material). The processing head is completed by connecting the delivery pump and the suction pump (either during the stamping phase or afterwards). The proposed processing head may be advantageously used to simplify several steps of the production process of the above-described solar cell, since its dynamic meniscus allows processing the wafer selectively in specific areas thereof (on its front surface and/or back surface). In this respect, it should be noted that this is the first time that a dynamic meniscus is proposed for use in the production of solar cells. Indeed, for example, U.S. Pat. No. 7,078,344 (the entire disclosure of which is herein incorporated by reference) only describes the use of a dynamic meniscus for implementing a selective etching process to correct non-uniformity in overburden conductive material (which is formed in dual damascene manufacturing processes); in any case, a corresponding proximity head that is described in this document is formed by multiple distinct inlets and outlets that are spaced apart to each other, along parallel lines or concentric rings.

Figure 6A:
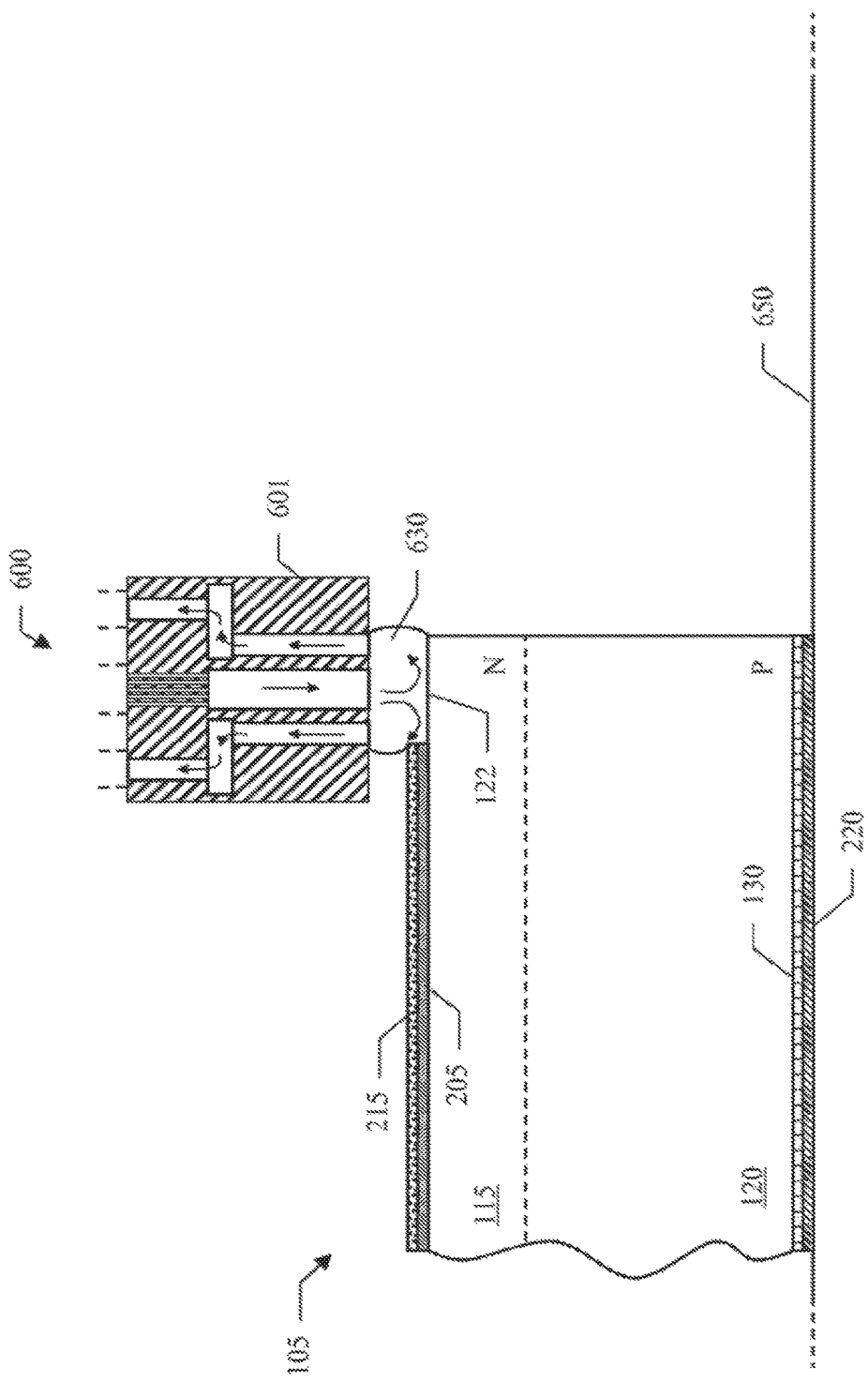

Particularly, FIG. 6A-6B shows an exemplary etching module 600 according to an embodiment (which may be used to clear a portion of the contact area 122 for the front contact terminal of the solar cell). Starting from FIG. 6A, for this purpose the etching module 600 includes an etching (processing) head (denoted with the reference 601), which is supplied with an etching solution (for example, made of HF). The wafer 105 is mounted on a transport system 650 (for example, based on a belt), which transports the wafer 105 under the etching module 600.

As soon as the front surface of the wafer 105 is brought in contact with a dynamic drop of the etching head 601 (for example, by raising the wafer 105 towards the etching head 601), the dynamic drop becomes a dynamic meniscus 630; the dynamic meniscus 630 then etch the anti-reflection coating 215 and the oxide layer 205. For example, a dynamic meniscus 630 made of a concentrated solution of HF at approximately 48% in volume completely removes the anti-reflection coating 215 and the oxide layer 205 in less than approximately 60 s (with this time that may be further reduced, for example, by increasing the temperature of the etching solution and/or changing the etching solution). In this way, the contact area 122 may be cleared without the need of any photolithography operation.

As a further improvement, as shown in FIG. 6B, in the meanwhile the belt 650 shifts the wafer 105 under the etching module 600 (along a corresponding transport direction—for example, from the left to the right in the figure). In this way, the etching head 601 clears the contact area 122 while crossing a corresponding portion of the wafer 105 (moving under it). As a result, the contact area 122 may be formed as a strip that crosses the whole wafer 105 (along its transport direction) by means of a smaller etching head 601, with the same size of the contact area 122 only transversally to the transport direction. Moreover, this allows processing a batch of wafers 105 continually without stopping them (under the etching head 601).

Figure 7A:
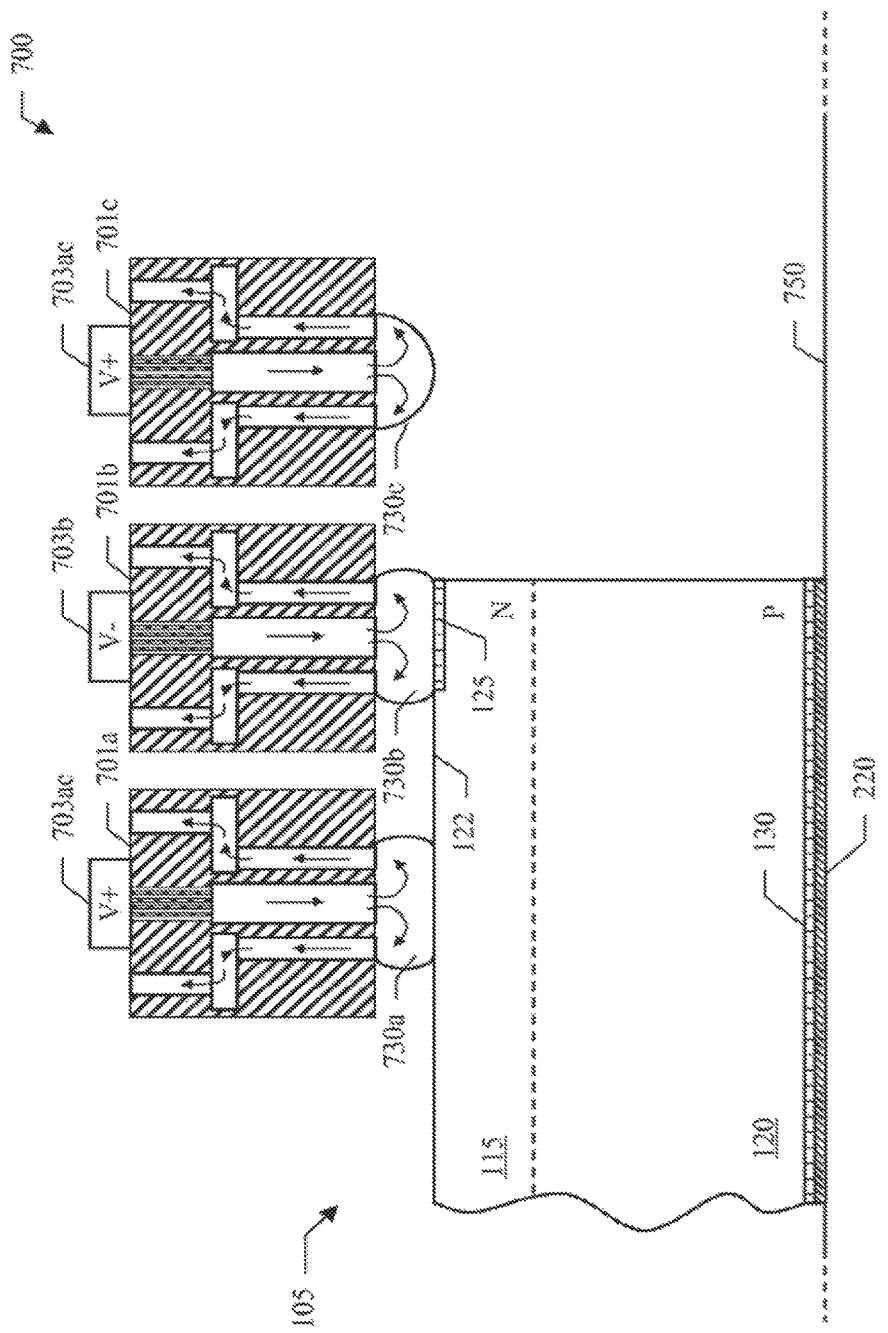

With reference now to FIG. 7A-7B, there is shown an exemplary anodization module 700 according to an embodiment (which may be used to make a portion of the porous silicon region 125 for the front contact terminal of the solar cell). Starting from FIG. 7A, for this purpose the anodization module 700 includes three processing heads (denoted with the references 701*a*, 701*b* and 701*c*). The anodization (processing) head 701*b* is supplied with an electrolytic solution (for example, being rich of HF); at the same time, the anodization head 701*b* is coupled to a terminal 703*b* that provides a biasing voltage V− to its substrate. The biasing (processing) heads 701*a*, 701*c* are instead supplied with a conductive solution that does not etch the wafer 105 (for example, made of KCl); at the same time, the biasing heads 701*a* and 701*c* are coupled to a common terminal 703*ac* that provides a biasing voltage V+ (higher than the biasing voltage V−) to both their substrates. The wafer 105 is mounted on a transport system 750 (for example, based on a belt), which transports the wafer 105 under the anodization module 700 (along a corresponding transport direction—for example, from the left to the right in the figure). The processing heads 701*a*, 701*b*, and 701*c* are arranged in succession along this transport direction.

As soon as the front surface of the wafer 105 is brought in contact with a dynamic drop 730*a*, 730*b*, and 730*c* of each processing head 701*a*, 701*b*, and 701*c*, respectively, the dynamic drop 730*a*-730*c* becomes a corresponding dynamic meniscus (denoted with the same reference)—in reality, the wafer 105 is far thinner than it is in the figure, so that the dynamic drops 730*a*-730*c* touch the belt 750 when outside the wafer 105.

Particularly, when the contact area 122 reaches the biasing head 701*a* and the anodization head 701*b* (thereby forming the corresponding dynamic menisci 730*a* and 730*b*, respectively), an electrolytic cell is defined by the biasing head 701*a* and the anodization head 701*b*—with a corresponding current flowing through the biasing head 701*a*, the dynamic meniscus 730*a*, the N-type layer 115, the dynamic meniscus 730*b*, and the anodization head 701*b*; the N-type layer 115 in contact with the dynamic meniscus 730*b* (providing the electrolytic solution) is then anodized, so as to form a corresponding portion of the porous silicon region 125.

Continuing to FIG. 7B, when the contact area 122 reaches the biasing head 701*c* (thereby forming the corresponding dynamic meniscus 730*c*), the biasing head 701*c* adds as an anode to the above-described electrolytic cell—with a corresponding current flowing through the biasing head 701*c*, the dynamic meniscus 730*c*, the porous silicon region 125 already formed, the N-type layer 115, the dynamic meniscus 730*b*, and the anodization head 701*b*. When the contact area 122 leaves the biasing head 701*a*, the electrolytic cell then remains formed by the biasing head 701*c* and the anodization head 701*b*. As above, the N-type layer 115 in contact with the dynamic meniscus 730*b* is anodized to continue forming the porous silicon region 125, until its completion when the contact area 122 leaves the anodization head 701*b*.

In this way, the porous silicon region 125 can be made in a very simple way (without the need of contacting the wafer 105 on its back surface); this also improves the uniformity of the porous silicon region 125, since it avoids any electrical contact through the PN junction of the wafer 105. Moreover, the porous silicon region 125 may be formed as a strip that crosses the whole wafer 105 (along its movement direction) by means of smaller processing heads 701a-701c, with the possibility of processing a batch of wafers continually without stopping them (under the processing heads 701a-701c).

Figure 7C:
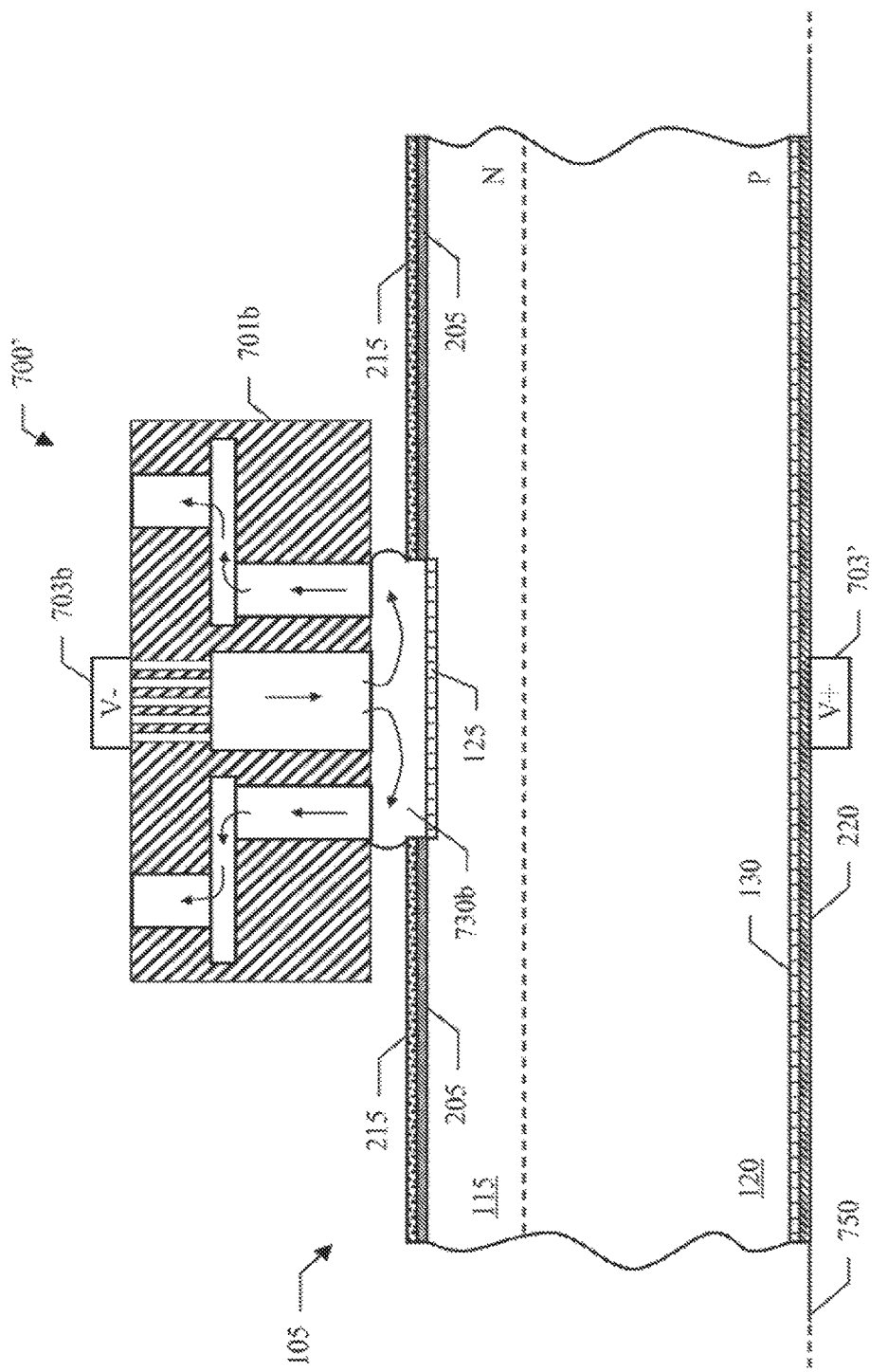

Considering FIG. 7C, there is shown an exemplary anodization module 700' according to another embodiment. In this case, the anodization module 700' only includes the anodization head 701b (without any biasing head); on the contrary, a terminal 703' provides the same biasing voltage V+ directly to the wafer 105, by contacting the thin metal layer 220 on its back surface.

This implementation simplifies the structure of the anodization module 700', since it includes a single anodization head 701b (at the cost of a more complex structure for contacting the back surface of the wafer 105).

Figure 8A:
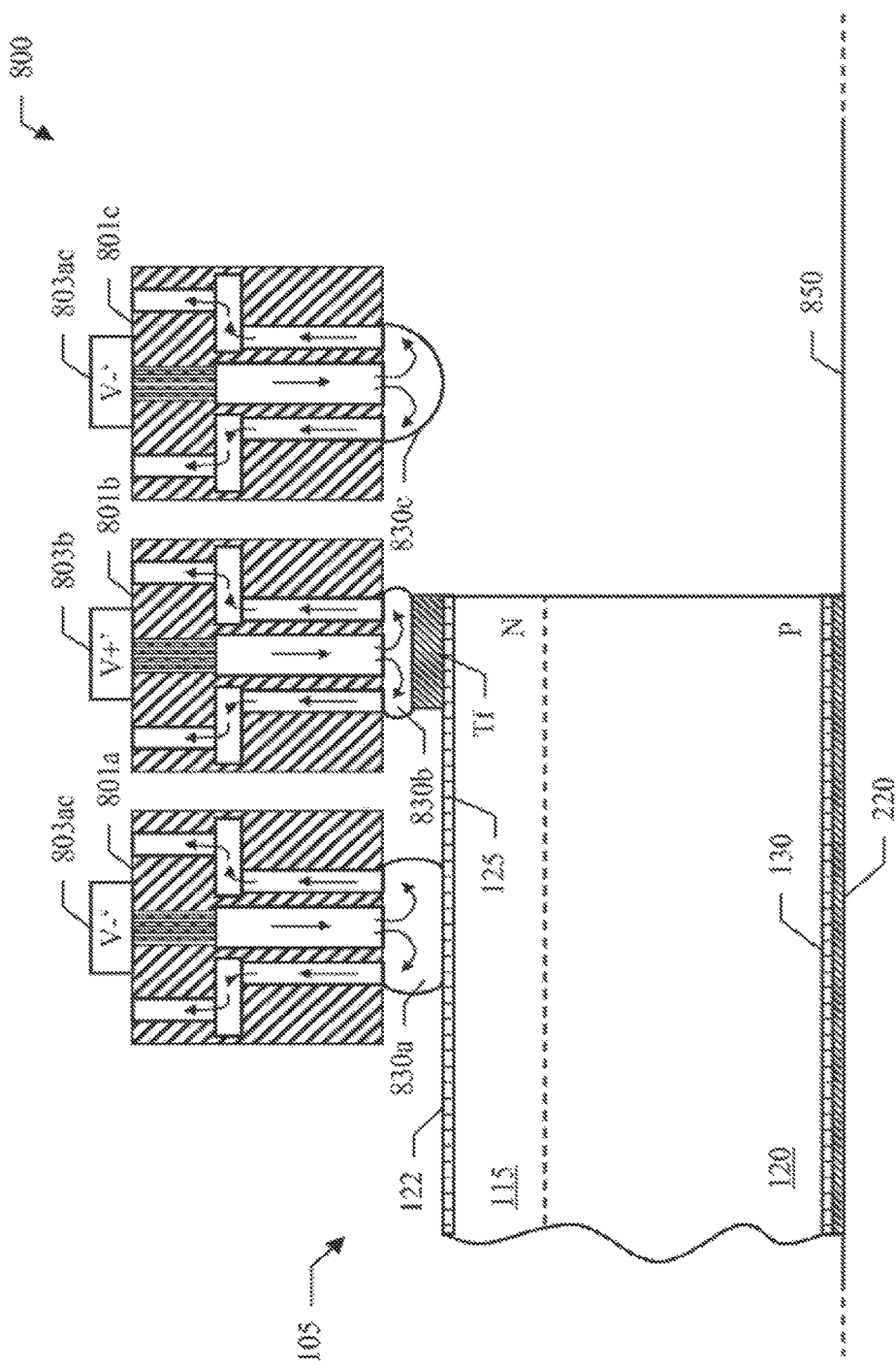
FIG. 8A-8C show two exemplary deposition modules that may be used to process the solar cell according to corresponding embodiments in different operative conditions.
Figure 8B:
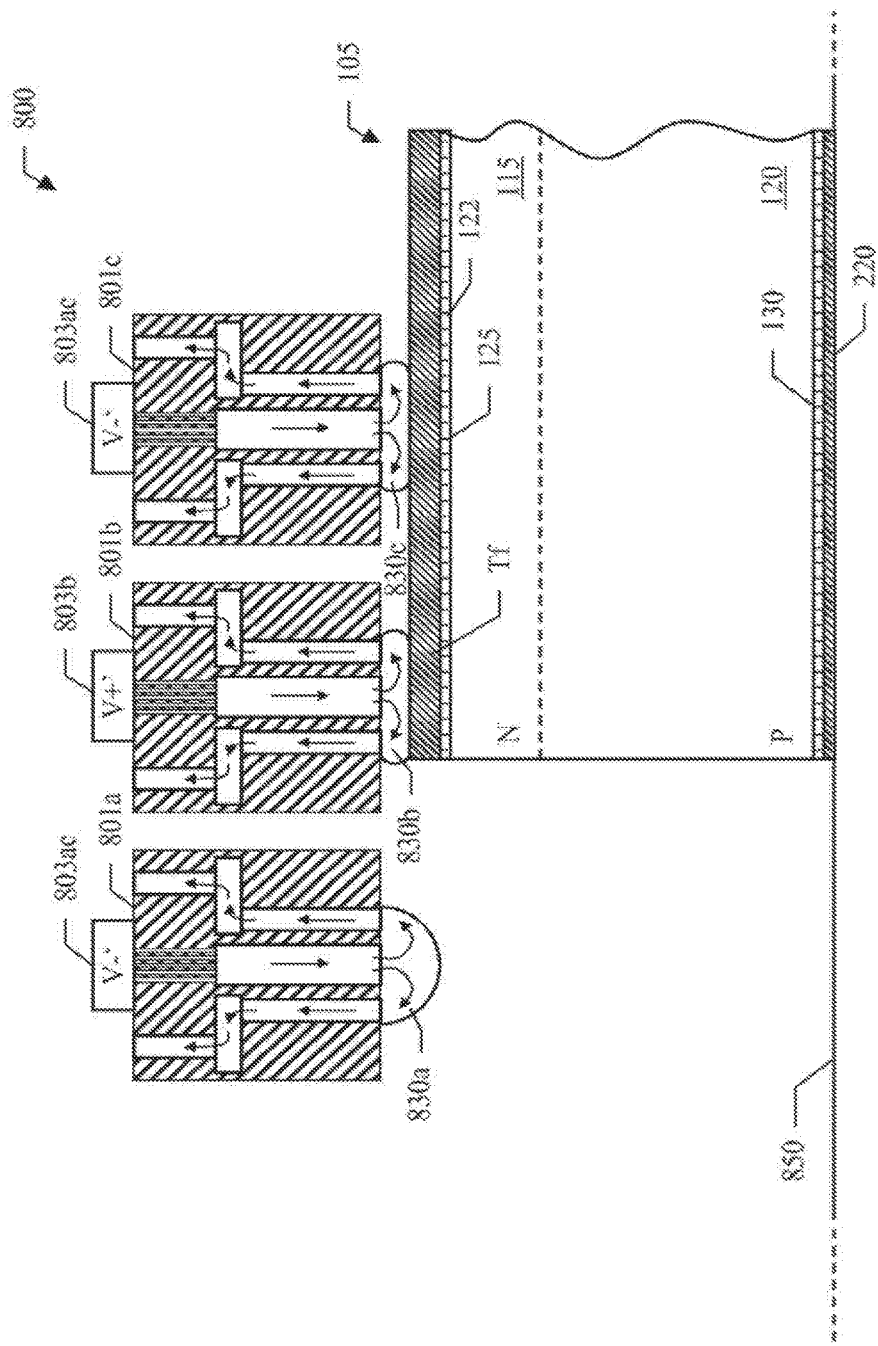

Moving to FIG. 8A-8B, there is shown an exemplary deposition module 800 according to an embodiment (which may be used to make a portion of the front contact terminal of the solar cell with an electrolytic deposition process). Starting from FIG. 8A, for this purpose the deposition module 800 includes three processing heads (denoted with the references 801a, 801b and 801c). The deposition (processing) head 801b is supplied with an electrolytic solution including a salt of the metal to be deposited (for example, Au, Ag, Pt, Ni, Cu, Co, Mo, Ru, PdCo, Pd, PdNi); at the same time, the deposition head 801b is connected to a terminal 803b that provides a biasing voltage V+' to its substrate. The biasing (processing) heads 801a,801c are instead supplied with a conductive solution that does not etch the wafer 105 (for example, made of KCl, or a solution with organic additives in order to decrease dissolution of the metal deposited, or liquid metal (e.g., Hg, Ga), or conductive liquid ink (e.g., non ionic solution plus metal nanoparticles or carbon nanotubes), or non-ionic solution (e.g., deionized water) used in case of alternating current biasing); at the same time, the biasing heads 801a and 801c are connected to a common terminal 803ac that provides a biasing voltage V−' (lower than the biasing voltage V+') to both their substrates. The wafer 105 is mounted on a transport system 850 (for example, based on a belt), which transports the wafer 105 under the deposition module 800 (along a corresponding transport direction—for example, from the left to the right in the figure). The processing heads 801a, 801b and 801c are arranged in succession along this transport direction.

As soon as the front surface of the wafer 105 is brought in contact with a dynamic drop 830a, 830b and 830c of each processing head 801a, 801b and 801c, respectively, the dynamic drop 830a-830c becomes a corresponding dynamic meniscus (denoted with the same reference)—as above, with the wafer 105 that is far thinner than it is in the figure, so that the dynamic drops 830a-830c touch the belt 850 when outside the wafer 105.

Particularly, when the porous silicon region 125 reaches the biasing head 801a and the deposition head 801b (thereby forming the corresponding dynamic menisci 830a and 830b, respectively), an electrolytic cell is defined by the deposition head 801b and the substrate 105, with the circuit that is closed by the liquid contact obtained from the substrate 105 to the biasing head 801a—with a corresponding current flowing through the deposition head 801b, the dynamic meniscus 830b, the porous silicon region 125, the dynamic meniscus 830a, and the biasing head 801a; a metal layer is then deposited on the porous silicon region 125 in contact with the dynamic meniscus 830b (providing the electrolytic solution, with the metal salts that are continuously replenished), so as to form a corresponding portion of the front contact terminal Tf.

Continuing to FIG. 8B, when the porous silicon region 125 reaches the biasing head 801c (thereby forming the corresponding dynamic meniscus 830c), the biasing head 801c adds an electric contact to the above-described electrolytic cell—with a corresponding current flowing through the deposition head 801b, the dynamic meniscus 830b, the porous silicon region 125, the front contact terminal Tf already formed, the dynamic meniscus 830c, and the biasing head 801c. When the porous silicon region 125 leaves the biasing head 801a, the electrolytic cell then remains formed by the deposition head 801b and the biasing head 801c. As above, the metal layer is deposited on the porous silicon region 125 in contact with the dynamic meniscus 830b to continue forming the front contact terminal Tf, until its completion when the porous silicon region 125 leaves the deposition head 801b.

In this way, the front contact terminal Tf is formed by a full electrolytic deposition process, without the need of previously making any thin metal layer by an electro-less deposition process (since the negative voltage being required to bias the wafer 105 is now applied to its front surface). This allows making the front contact terminal Tf very thick in a relatively short time (with a consequent reduction of the production cost of the solar cell); for example, the front contact terminal Tf may be made of Ni with a deposition rate up to approximately 20 μm×minute or of Cu with a deposition rate of approximately 5-15 μm×minute. Moreover, as above the front contact terminal Tf may be formed as a strip that crosses the whole wafer 105 (along its movement direction) by means of smaller processing heads 801a-801c, with the possibility of processing a batch of wafers continually without stopping them (under the processing heads 801a-801c).

Figure 8C:
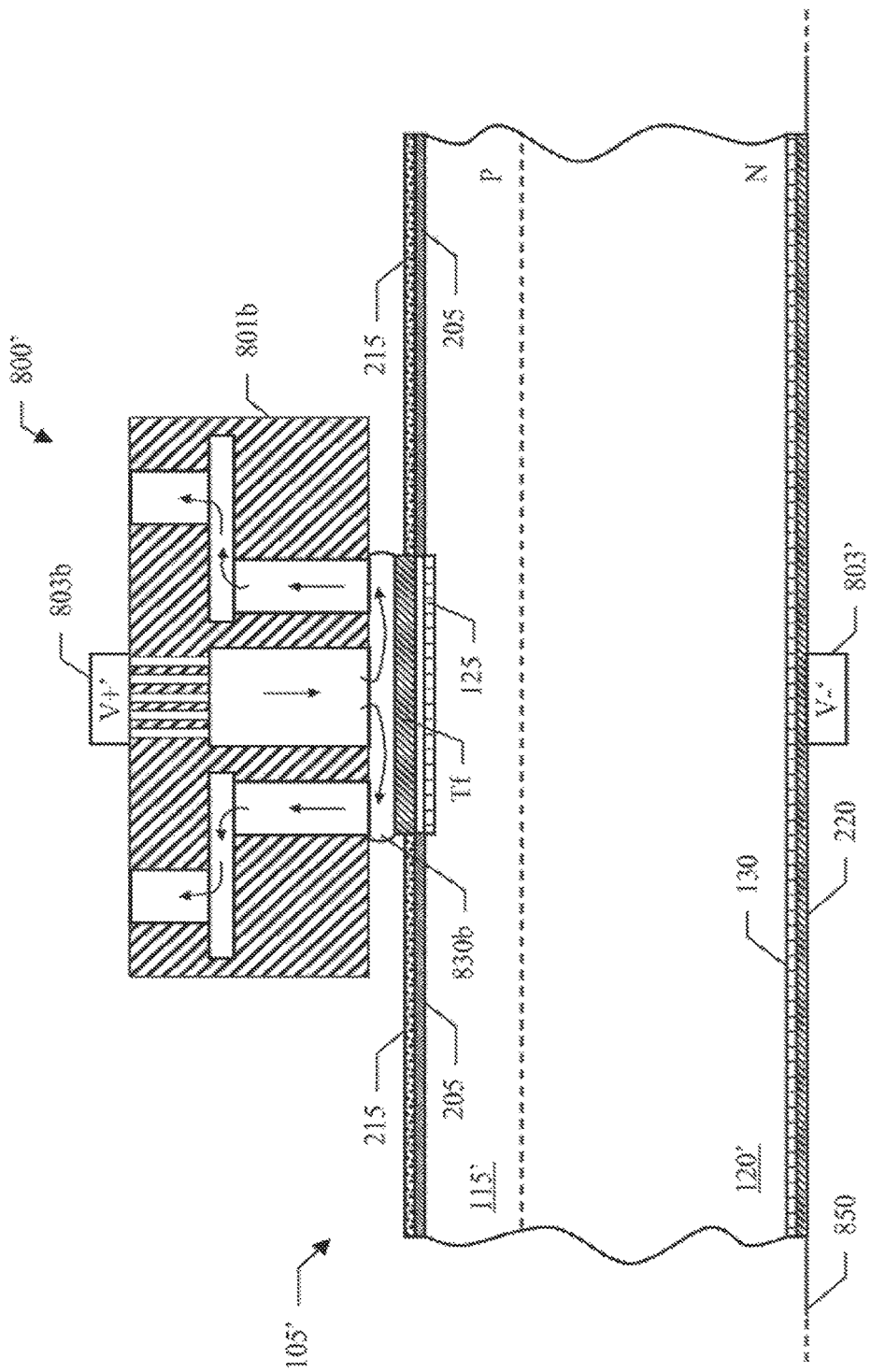

Considering FIG. 8C, there is shown an exemplary deposition module 800' according to another embodiment. The deposition module 800' is used to process a solar cell as above, which is now formed in a wafer 105' of the N-type (i.e., with an upper P-type layer 115' and a lower N-type layer 120'). In this case, the deposition module 800' only includes the deposition head 801b (without any biasing head); on the contrary, a terminal 803' provides the same biasing voltage V−' directly to the wafer 105', by contacting the thin metal layer 220 on its back surface. This is now possible because the voltage that is applied between the deposition head 801b (V+') and the back surface of the wafer 105' (V−') forward biases the PN junction 115'-120', so that is does not interfere with the deposition process.

As above, this implementation simplifies the structure of the deposition module 800', since it includes a single deposition head 801b.

As a further improvement, in both cases (see FIG. 8A-FIG. 8B and FIG. 8C) in the meanwhile the belt 850 may also move the wafer 105,105' away from the deposition head 801b along a direction of deposition of the metal layer of the front contact terminal Tf—i.e., vertically (for example, by lowering the wafer 150,105'). In this way, it is possible to form the front contact terminal Tf with an elongated shape, which extends perpendicularly (i.e., upwards) from the front surface of the wafer 105,105'. In addition, the transport system 850 may also shift the wafer 105,105' transversally to the deposition direction (for example, by rotating it); in this way, it is possible to obtain any complex shape of the front contact terminal Tf (for example, spiral-like).

The above-mentioned additional features allow forming the front contact terminal Tf with a shape and a structure (either rigid or elastic) that facilitates its coupling; moreover, this result is achieved in a very simple way.

Figure 9A:
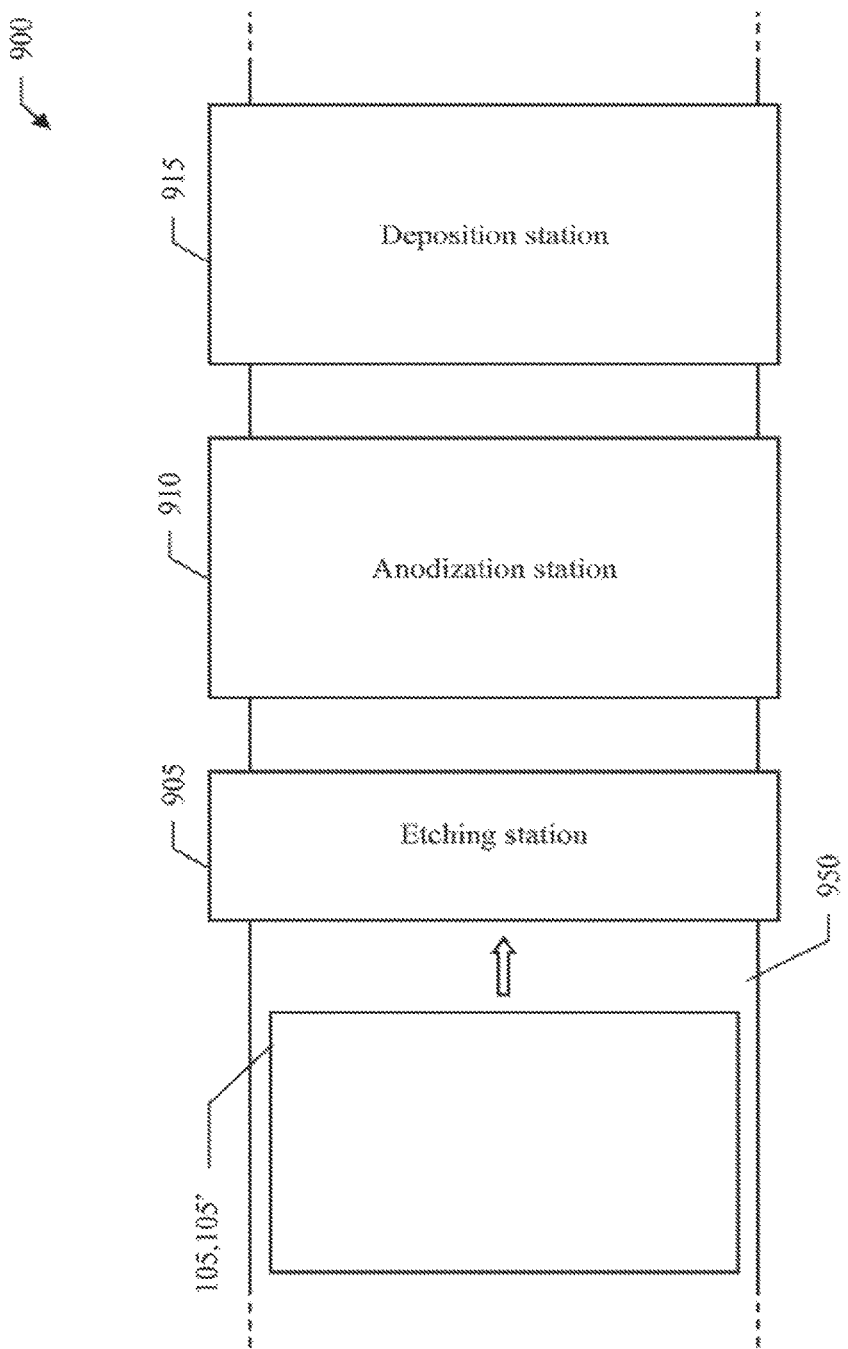
FIG. 9A shows a schematic block diagram of a production line of solar cells according to an embodiment.

Considering now FIG. 9A, there is shown a schematic block diagram of a production line 900 of the solar cells according to an embodiment.

Particularly, the production line 900 includes a pipeline of an etching station 905, an anodization station 910 and a deposition station 915; a feeding system 950 (for example, based on a belt) feeds a batch of wafers 105,105' in succession across the etching station 905, the anodization station 910 and the deposition station 915 (along a corresponding feeding direction, from the left to the right in the figure). The etching station 905 is formed by one or more of the above-described etching modules (arranged transversally to the feeding direction—i.e., vertically in the figure), each one for clearing a corresponding portion of a contact area in the wafer 105,105' currently under it. The anodization station 910 is formed by one or more of the above-described anodization modules (arranged transversally to the feeding direction—i.e., vertically in the figure), each one for making a corresponding portion of a porous silicon region in a further wafer 105,105' currently under it. The deposition station 915 is formed by one or more of the above-described deposition modules (arranged transversally to the feeding direction—i.e., vertically in the figure), each one for making a corresponding portion of a (front and/or back) contact terminal in a still further wafer 105,105' currently under it.

In this way, the wafers 105,105' may be processed continually, even without stopping them under the different stations 905-915. This allows obtaining a very high throughput of the production line 900, which dramatically reduces the production cost of the solar cells; for example, after a latency time (required by a first wafer 105,105' to pass through the whole production line 900), the throughput of the production line 900 can reach approximately 3,000-4,000 solar cells per hour.

The etching station 905, the anodization station 910 and the plating station 915 may have different architectures.

Figure 9B:
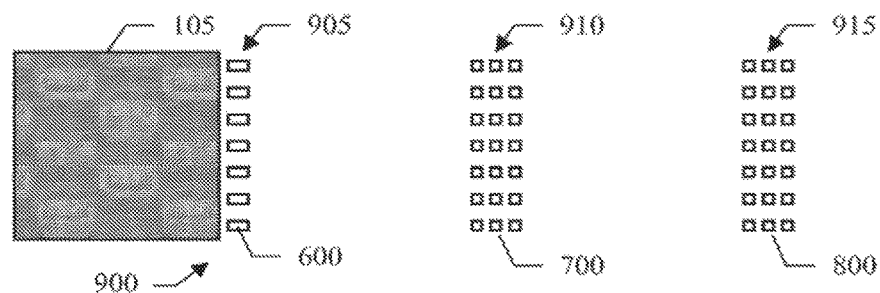
FIG. 9B-FIG. 9Q show different exemplary architectures of this production line according to corresponding embodiments in different operative conditions.

Particularly, in an embodiment of the invention (as shown in FIG. 9B), the etching station 905 includes, for each contact strip of the front contact terminal (seven in the example at issue), the etching module 600 as above—with its etching head, in the present example, which is shorter than the wafer 105 along its feeding direction (from the left to the right). The anodization station 910 includes, for each contact strip of the front contact terminal, the anodization module 700 as above—with its three processing heads (i.e., one anodization head and two biasing heads) that are again shorter than the wafer 105 along its feeding direction. Likewise, the plating station 915 includes, for each contact strip of the front contact terminal, the plating module 800 as above—with its three processing heads (i.e., one plating head and two biasing heads) that are again shorter than the wafer 105 along its feeding direction.

Figure 9C:
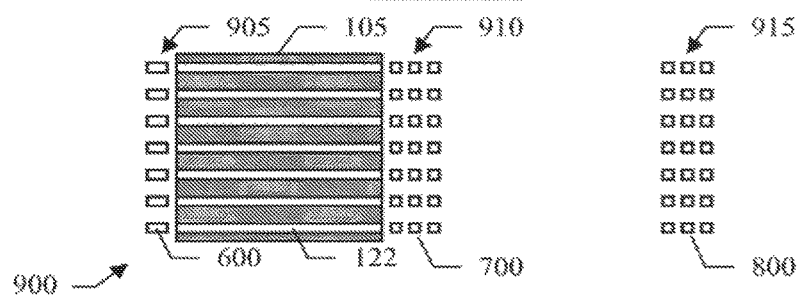

Moving to FIG. 9C, when the wafer 105 passes through the etching station 905, each etching module 600 clears a corresponding strip of the contact area 122 in the wafer 105 (with the strip of the contact area 122 that crosses the whole wafer 105 along its feeding direction).

Figure 9D:
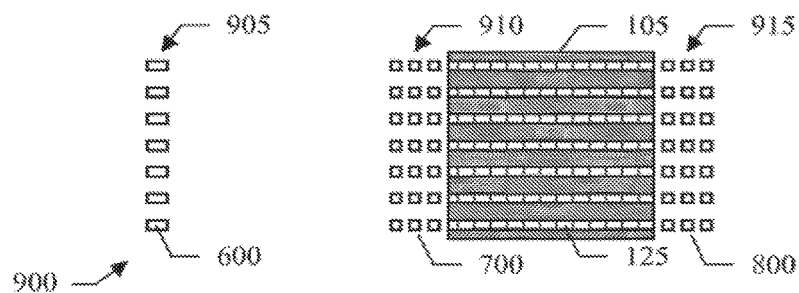

With reference now to FIG. 9D, when the wafer 105 passes through the anodization station 910, each anodization module 700 forms a corresponding strip of the porous silicon region 125 in the associated contact area (with the strip of the porous silicon region 125 that crosses the whole wafer 105 along its feeding direction).

Figure 9E:
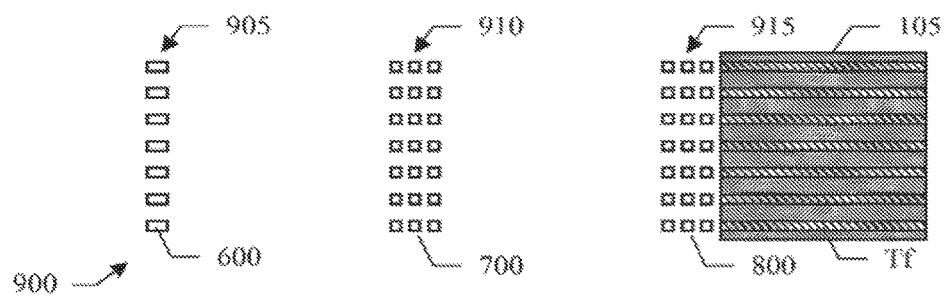

At the end, as shown in FIG. 9E, when the wafer 105 passes through the plating station 915, each plating module 800 forms the corresponding contact strip of the front contact terminal Tf on the associated porous silicon region (with the contact strip that crosses the whole wafer 105 along its feeding direction).

The above-described structure allows forming the front contact terminal Tf without any protective photo-resist mask on the anti-reflection coating of the wafer, since the anodization modules 700 applies the electrolytic solution only where it is necessary (i.e., on the corresponding strips of the porous silicon region); moreover, in this case it is possible to use whatever electrolytic solution without any risk of damaging the anti-reflection coating.

Figure 9F:
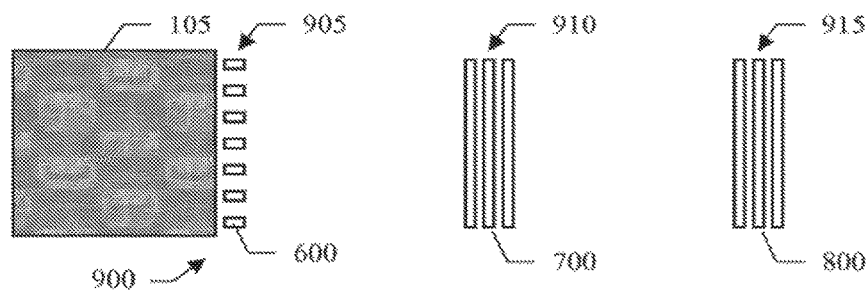

In a different embodiment (as shown in FIG. 9F), the etching station 905 is the same as above. Instead, the anodization station 910 includes a single anodization module 700 for all the contact strips of the front contact terminal—with its three processing heads that extends along the whole width of the wafer 105 transversally to its feeding direction (i.e., vertically in the figure). Likewise, the plating station 915 includes a single plating module 800 for all the contact strips of the front contact terminal—with its three processing heads that extends along the whole width of the wafer 105 transversally to its feeding direction.

Figure 9G:
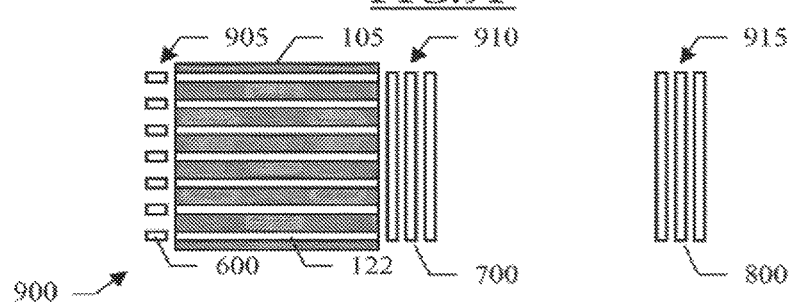

Moving to FIG. 9G, as above when the wafer 105 passes through the etching station 905, each etching module 600 clears the corresponding strip of the contact area 122 in the wafer 105 (with the strip of the contact area 122 that crosses the whole wafer 105 along its feeding direction).

Figure 9H:
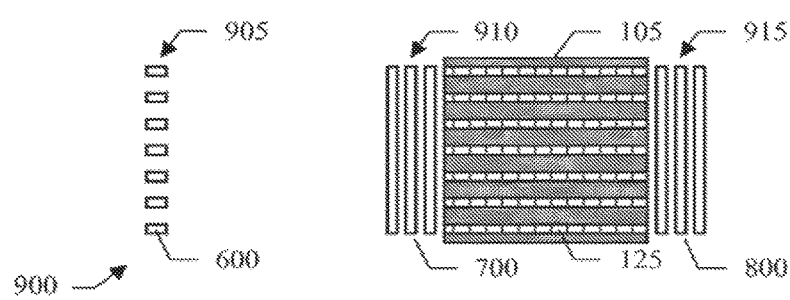

With reference now to FIG. 9H, when the wafer 105 passes through the anodization station 910, the anodization module 700 forms all the strips of the porous silicon region 125 in the contact area (with the strips of the porous silicon region 125 that cross the whole wafer 105 along its feeding direction); in this respect, it is noted that, even though the anodization module 700 acts on the whole wafer 105, it is effective only on the contact area that is not covered by the protective layer of the wafer 105.

Figure 9I:
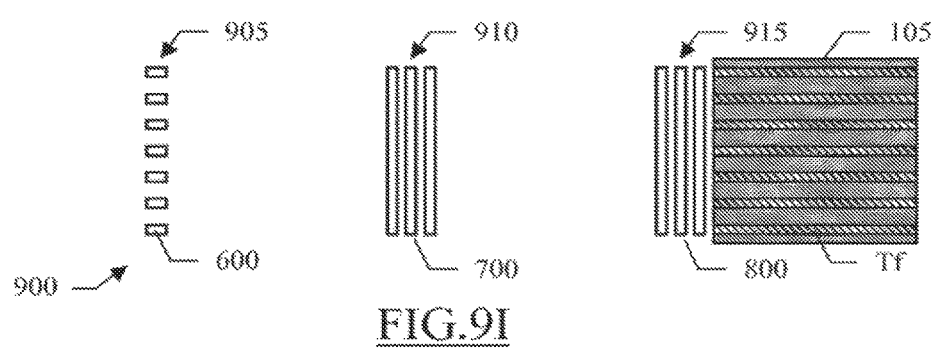

At the end, as shown in FIG. 9I, when the wafer 105 passes through the plating station 915, the plating module 800 forms all the contact strips of the front contact terminal Tf on the porous silicon region (with the contact strips that cross the whole wafer 105 along its feeding direction). As above, even though the plating module 800 acts on the whole wafer 105, it is effective only on the porous silicon region that is not covered by the protective layer of the wafer 105.

The above-described structure simplifies the production line (but it entails the use of an electrolytic solution that does not damage the antireflection coating of the wafer 105—for example, with a concentration of HF lower than approximately 20%).

In both cases, it is possible to use a similar structure to form the two contact buses of the front contact terminal (after rotating the wafer by approximately 90°—such as by means of a corresponding rotating platform)—for example, with a further etching station, anodization station and deposition station that are arranged downstream the above-described etching station, anodization station and deposition station, respectively.

Figure 9J:
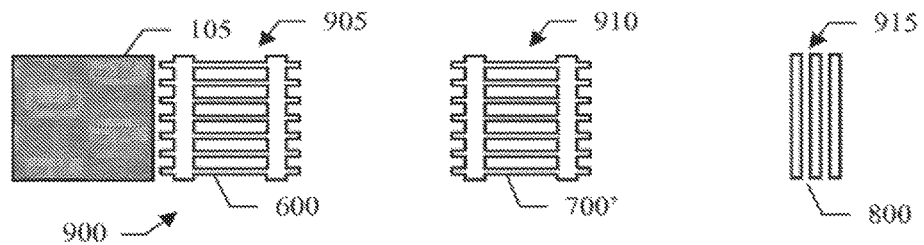

In another embodiment (as shown in FIG. 9J), the etching station 905 includes a single etching module 600 with the same shape of the whole front contact terminal (including its contact strips and contact buses). Likewise, the anodization station 910 includes a single anodization module 700' with the same shape of the whole front contact terminal. The plating station 915 instead includes the same plating module 800 as above, with its three processing heads that extends along the whole width of the wafer 105 transversally to its feeding direction (similar considerations apply if the plating station 915 includes three distinct processing heads for each contact strip of the front contact terminal).

Figure 9K:
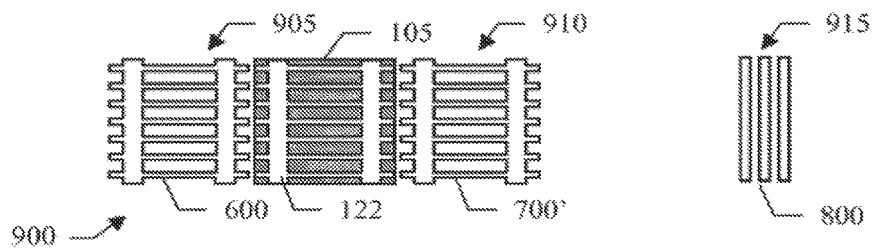

Passing to FIG. 9K, the wafer 105 moves towards the etching station 905 without entering in contact thereto (for example, because it is lowered or spaced apart laterally); when the wafer 105 reaches the desired position under the etching station 905, it is stopped and brought in contact thereto (for example, by moving it upwards or laterally). In this way, the etching module 600 in one-shot clears the whole contact area 122 (for the front contact terminal) in the wafer 105.

Figure 9L:
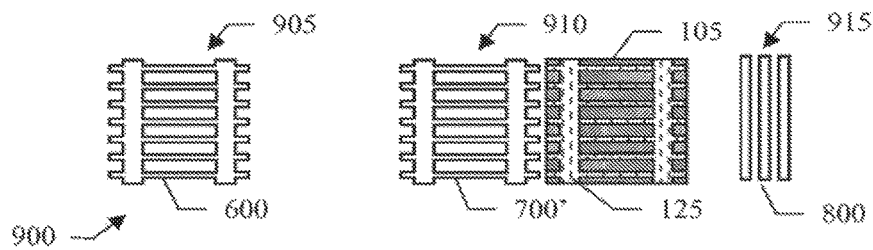

With reference now to FIG. 9L, the wafer 105 is moved away from the etching station 905 (for example, downwards or laterally), and then moved towards the anodization station 910; when the wafer 105 reaches the desired position under the anodization station 910, it is stopped and brought in contact thereto (for example, by moving it upwards or laterally). In this way, the anodization module 700' in one-shot forms the whole porous silicon region 125 in the contact area.

Figure 9M:
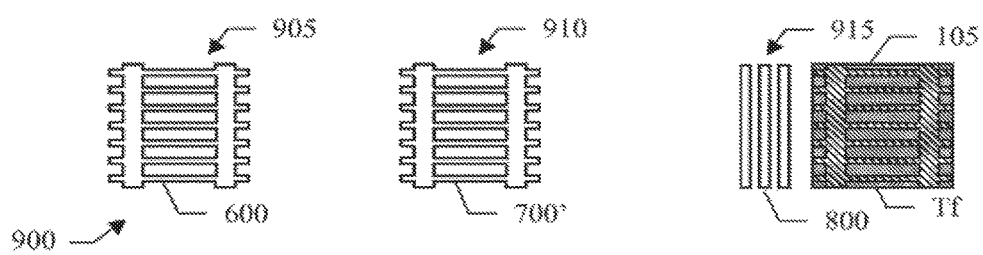

At the end, as shown in FIG. 9M, the wafer 105 passes through the plating station 915, wherein the plating module 800 forms the whole front contact terminal Tf on the porous silicon region as above.

The above-described structure allows forming the porous silicon region with whatever shape in a single passage, without any constraint on the electrolytic solution (but it does not allow processing the wafers 105 continually without stopping them).

Figure 9N:
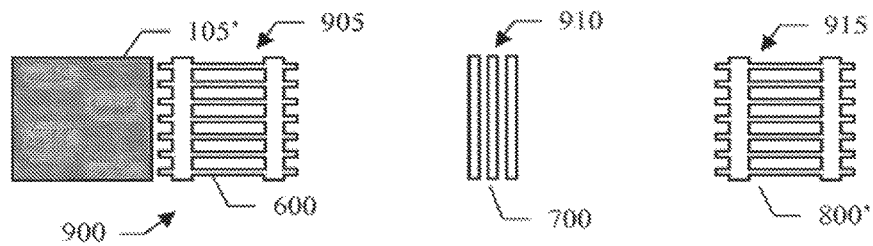

In a further embodiment (as shown in FIG. 9N), the production line is used to process wafers 105' of the N-type. In this case, the etching station 905 includes a single etching module 600 with the same shape of the whole front contact terminal as above. Likewise, the deposition station 915 includes a single deposition module 800' with the same shape of the whole front contact terminal. The anodization station 910 instead includes the same anodization module 700 as above, with its three processing heads that extends along the whole width of the wafer 105' transversally to its feeding direction (similar considerations apply if the anodization station includes three distinct processing heads for each contact strip of the front contact terminal).

Figure 9O:
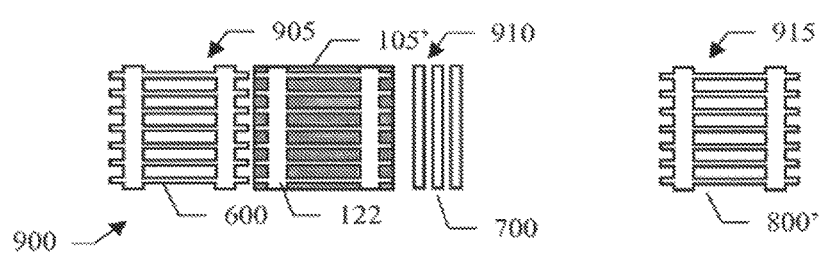

Passing to FIG. 9O, the wafer 105' again moves towards the etching station 905 without entering in contact thereto; when the wafer 105' reaches the desired position under the etching station 905, it is stopped and brought in contact thereto, so that the etching module 600 in one-shot clears the whole contact area 122 in the wafer 105'.

Figure 9P:
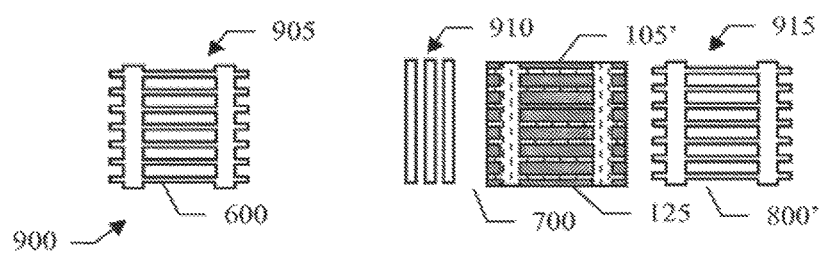
Figure 9Q:
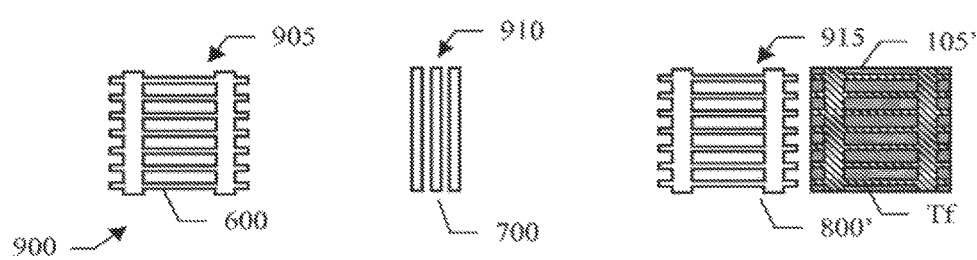

With reference now to FIG. 9P, as above the wafer 105' passes through the anodization station 910, wherein the anodization module 700 forms the whole porous silicon region 125 in the contact area.

At the end, as shown in FIG. 9M, the wafer 105' moves towards the deposition station 915 without entering in contact thereto (for example, because it is lowered or spaced apart laterally); when the wafer 105' reaches the desired position under the deposition station 915, it is stopped and brought in contact thereto (for example, by moving it upwards or laterally). In this way, the deposition module 800' in one-shot forms the whole front contact terminal Tf on the porous silicon region.

The above-described structure allows forming the front contact terminal Tf with whatever shape in a single passage, without any constraint on the electrolytic solution (but it does not allow processing the wafers 105' continually without stopping them).

Additional structures of the production line may be obtained by combining the above-described etching station, anodization station, and deposition station in different ways. For example, in a further embodiment the etching station 905 and the anodization station 910 of the FIG. 9B are used to form the portions of the contact area and of the porous silicon region, respectively, for the contact strips when the wafer 105 passes through them. A further etching station and a further anodization station with the same structure are then used to form the portions of the contact area and of the porous silicon region, respectively, for the contact buses when the wafer 105 (after being rotated by approximately 90°) passes through them. The deposition station 915 of the FIG. 9F is then used to form the contact strips and the contact buses at the same time when the wafer 105 (after being rotated by any angle higher than 0° and lower than 90°, for example, between 40° and 50°, such as 45°) passes through it. Alternatively, the same result may also be obtained by using the anodization station 910 of the FIG. 9F to form the whole porous silicon region at the same time when the wafer 105 (after being rotated by 45°) passes through it.

In this way, the wafers 105 may be processed continually without stopping them under the different stations 905-915 with a reduced number thereof. Naturally, in order to satisfy local and specific requirements, a person skilled in the art may apply to the embodiments described above many logical and/or physical modifications and alterations. More specifically, although this disclosure includes a certain degree of particularity with reference to one or more embodiments thereof, it should be understood that various omissions, substitutions and changes in the form and details as well as other embodiments are possible. Particularly, different embodiments may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment may be incorporated in any other embodiment as a matter of general design choice.

For example, similar considerations apply if the solar cell has a different structure or includes equivalent components (either separate to each other or combined together, in whole or in part); moreover, the solar cell may have different operative characteristics. For example, the solar cell may be of the mono-layer type, of the multi junction type, and the like.

More generally, the same solution may also be applied to any photovoltaic cell (adapted to convert whatever kind of light energy into electric energy). Likewise, the solar cell may be made in a substrate of a different starting silicon material (e.g. N-type mono-crystalline or poly-crystalline) and/or different semiconductor material that allows forming a corresponding layer of porous semiconductor material (such as Ge, GaP, InP, SiC, and $Si_{1-x}Ge_x$). The contact terminals may be made of one or more different conductive materials (for example, with the addition of a solder-wettable layer); moreover, the contact terminals may have any shape or profile (for example, with the back contact terminal having a grid structure as well), and they may be arranged in any number in whatever position (even all of them on the same front or back surface of the substrate—for example, only with back contacts but no front contact).

Likewise, the porous semiconductor regions of each contact area may have any shape and they may be arranged in any number in whatever position. For example, it is possible to provide a single porous semiconductor region only in part of the contact area (for example, a strip or a frame around its border).

Each porous semiconductor region may have different values of porosity; moreover, the porosity may decrease moving away from the corresponding surface of the substrate in another way (for example, within a different range).

Each porous semiconductor region may have different thickness (with the corresponding contact terminal that may also not penetrate completely within its whole thickness).

The additional layer of (uniform) porous semiconductor (acting as gettering center) may have any other thickness and/or porosity (even if this feature is merely optional).

Likewise, the porous silicon region may have a different porosity on the contact area (even changing continually inwards from its border).

Similar considerations apply if the processing head has a different structure or includes equivalent components (either separate to each other or combined together, in whole or in part). For example, each delivery and/or suction mouth may have any shape and size (for example, with circular, squared, cross-like, or of whatever complex pattern profile). Likewise, the suction duct may be arranged at a different distance from the delivery duct (even changing according to the width of the adjacent portion of the delivery duct). In any case, the processing head may be used either to process the solar cell on its front surface and/or on its back surface. Moreover, the same structure may be obtained with equivalent processes (for example, by directly making throughholes that cross the whole substrate with any kind of mechanical and laser drilling processes). In any case, the proposed processing head lends itself to be used turned top-down (so as to act on the substrate placed above it).

The processing heads may also be made of any other (conductive and/or insulating) material—for example, by inserting metal contacts to allow applying the required biasing voltages between the processing head and the wafer (either for the anodization process or for the deposition process); particularly, it is possible to form each processing head in silicon with a combination of different substrates of P-type and N-type that (after being bonded to each other) form a processing head that may be reverse or forward biased depending on the applied voltage.

In any case, the suction duct (of the anodization/deposition head) may be arranged around the delivery duct in a different way—even with distinct elements being placed close to each other (particularly for simple shapes thereof, where it is not required that the delivery duct should be completely surrounded by the suction duct). Different voltages may be used during either the anodization process or the deposition process (for example, with voltages varying around an average value in a pulse deposition process, with voltages of reverse polarity during a short period of the deposition process to increase the properties of the contact terminals, and the like). More generally, the anodization/deposition head and the wafer may be biased to any voltages that allow creating a conductive path between them.

Nothing prevents controlling the size of the dynamic menisci in any other way, or to have the dynamic menisci always with fixed size. Similar considerations apply if the wafer and the processing heads move with respect to each other in a different way (for example, by moving the processing heads in addition or in alternative to the wafer). In a different embodiment, the anodization/deposition module acting on a single surface of the wafer may be formed by only two heads (i.e., the anodization/deposition head and a single biasing head). In this case, it is generally not possible to treat the whole contact area (since the required conductive path between the two heads breaks as soon as one of them leaves the wafer); however, this may be not a problem in specific applications (for example, when the anodization module is used to form the porous semiconductor region that may also not extend throughout the whole contact area).

The desired movement of the deposition head with respect to the wafer (for forming the contact terminals with elongated shape) may be achieved in any other way—for example, by moving the deposition head in addition or in alternative to the wafer; moreover, the movement may be of any other type (for example, only perpendicular to the front/back surface of the wafer, only parallel thereto, or any combination thereof).

Likewise, the production line may have a different structure or it may include equivalent components (either separate to each other or combined together, in whole or in part). For example, nothing prevents providing a parallel structure wherein more solar cells are processed concurrently (so as to further increase the throughput of the production line). Moreover, the above-described architectures of the production line may be combined to each other (with their different modules that may be arranged either in succession or interleaved). In any case, the production line may also be used to process the solar cells in a different way; for example, it is possible to implement part of the above-described operations only, down to a single one (for example, without the etching station), to process the back surface of the wafers in a similar way, and the like.

Similar considerations apply if the contact terminal, the porous silicon region and the contact area have different size and/or shape (for example, with any other number of strips with whatever width and arrangement).

The substrate may be rotated with other equivalent means and/or by other angles in whatever position along the production line.

An embodiment lends itself to be implemented with an equivalent method (by using similar steps, removing some steps being non-essential, or adding further optional steps); moreover, the steps may be performed in a different order, concurrently or in an interleaved way (at least in part).

Particularly, the porous semiconductor may be formed with any other technique—such as by a spark erosion or a stain etching process (for example, see "Pits and Pores II: Formation, properties, and significance for advanced materials, ISBN 1566772923", the entire disclosure of which is herein incorporated by reference). Similar considerations apply to the deposition process of the contact terminals, which may be completely of the electro-less type, completely of the electrolytic type, or of any combination thereof (or more generally with the contact terminals that are made with any other additional and/or alternative process).

Moreover, the porosity may be modulated (within the wafer) in a different way—for example, by varying the current density between different values and/or with any other time pattern (for example, according to a linear, parabolic or logarithmic law); the same result may also be achieved by acting on any other parameter of the anodic process (or a combination thereof), such as the temperature, or by varying the doping concentration of the substrate. In any case, the use of porous semiconductor regions with a uniform porosity within the substrate is contemplated.

Although in the preceding description reference has been made to solar cells, it should be understood that the same technique lends itself to be applied in different applications. For example, the porous semiconductor regions may be used to anchor thin metal layers on a substrate for their bonding to other structures, especially in localized eutectic bonding between silicon and gold for the encapsulation of Micro-ElectroMechanical Systems (MEMSs), or more generally whenever a high adhesion of a thin or thick metal layer on a semiconductor substrate is required.

In any case, the above-described head, module and/or production line may also be used in other applications (whenever etching, anodization and/or deposition processes are required). More generally, an embodiment of the proposed structure lends itself to implement a general-purpose electrolytic cell. For example, in a different embodiment it is possible to deposit any three-dimensional structure on a conductive substrate (for example, made of metal or silicon)—either with multiple heads (for biasing the substrate on the same surface) or with a single head (with the direct biasing of the substrate on its opposite surface). For this purpose, each head and the substrate may move away from each other during the deposition (for example, by raising the head and/or lowering the substrate) to form elongated structures with any height and shape (according to the geometry of the dynamic meniscus as defined by the corresponding delivery and suction months). For example, rods (with any section) may be obtained with the above-described heads; alternatively, tubes may be obtained by adding a further suction mouth inside the delivery duct so as to create an empty region inside the dynamic meniscus. In addition, it is also possible to obtain structures with variable section along their length (for example, of the helicoidal type) by also moving the head and/or the substrate transversally during their spacing apart (for example, with a rotational component). Particularly, the structures so obtained may be used in probe cards, packaging substrates, electro-medical electrodes, MEMS structures, and the like (with the possible addition of a polymeric or ceramic precursor material between them).

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A method for performing an electrolytic process continually on a batch of substrates, the method including:
   delivering a solution continuously without stopping during the electrolytic process through at least one delivery mouth of each of a set of electrolytic heads on an operative surface of a support element of the electrolytic head being made at least partially of an electrically conductive material configured to contact the electrolytic solution, the electrolytic heads including an electrolytic head with the solution being delivered by said at least one delivery mouth of the electrolytic head being an electrolytic solution,
   sucking the delivered solution through at least one suction mouth arranged around said at least one delivery mouth on the operative surface of the support element using a suction pump that creates a depression at the suction mouth thereby forming a self-sustaining dynamic drop on the operative surface of the support element in a fixed position with a content of the dynamic drop that is continuously refreshed thanks to a flow of the solution from the delivery mouth to the suction mouth, the dynamic drop being formed by a portion of the solution that remains attached to the operative surface of the support element without being loosened by the electrolytic head and without being in contact with the substrate,
   feeding the substrates in succession across the electrolytic heads thereby bringing a corresponding portion of each substrate in contact with each dynamic drop previously formed on the operative surface of the support element, the dynamic drop transforming into a corresponding dynamic meniscus when contacted by the substrate,
   applying a first biasing voltage to the electrolytic solution through the electrolytic head, and
   applying a second biasing voltage to the substrate.

2. The method according to claim 1, wherein the electrolytic head acts on a first surface of the substrate, the method comprising:
   applying the second biasing voltage to a second surface of the substrate opposite the first surface of the substrate to create a conductive path with the electrolytic head through the substrate.

3. The method according to claim 1, further including:
   controlling a size of the dynamic meniscus by changing an inflow of the solution and/or a depression in each suction mouth.

4. The method according to claim 1, wherein the substrates are fed in succession without stopping across the electrolytic heads.

5. The method according to claim 1, wherein the electrolytic head acts on a first surface of the substrate and wherein the electrolytic heads include at least one biasing head, the solution delivered by said at least one delivery mouth of each biasing head being a conductive solution, the method comprising:
   applying the second biasing voltage to the substrate through the conductive solution and each biasing head, said at least one biasing head acting on the first surface of the substrate to create a conductive path with the electrolytic head through the substrate.

6. The method according to claim 5, wherein the method comprising:
   feeding the substrates along a movement direction, said at least one biasing head including a first biasing head and a second biasing head arranged upstream and downstream, respectively, the electrolytic head along the movement direction to maintain the conductive path while the substrate passes through the electrolytic head.

7. The method according to claim 1, wherein the electrolytic process is an anodization process.

8. The method according to claim 7, wherein the method comprises forming porous semiconductor regions on the substrate.

9. The method according to claim 1, wherein the electrolytic process is a deposition process for depositing conductive structures on the substrate electrolytically.

10. The method according to claim 9, wherein the method comprises:
    sucking the delivered solution through at least one further suction mouth arranged inside each delivery mouth on the operative surface of the support element thereby forming an empty region inside the corresponding dynamic drop to generate a hollow structure of the conductive structures.

11. The method according to claim 9, wherein the method comprises:

moving the substrate and the electrolytic head along a deposition direction of the conductive structures during the deposition thereof to obtain an elongated shape of the conductive structures along the deposition direction, the deposition direction extending transversally to the substrate.

12. The method according to claim 11, wherein the method comprises:
moving the substrate and the electrolytic head along a shifting direction during the deposition of the conductive structures to obtain a variable section of the conductive structures along the deposition direction, the shifting direction extending transversally to the deposition direction.

13. The method according to claim 12, wherein the method comprises:
rotating the substrate with respect to the electrolytic head during the deposition of the conductive structures.

14. A method for performing an etching process continually on a batch of substrates, the method including:
delivering an etching solution continuously without stopping during the electrolytic process through at least one delivery mouth of an electrolytic head on an operative surface of a support element of an etching head,
sucking the delivered etching solution through at least one suction mouth completely surrounding said at least one delivery mouth on the operative surface of the support element using a suction pump that creates a depression at the suction mouth thereby forming a self-sustaining dynamic drop on the operative surface of the support element in a fixed position with a content of the dynamic drop that is continuously refreshed thanks to a flow of the etching solution from the delivery mouth to the suction mouth, the dynamic drop being formed by a portion of the electrolytic solution that remains attached to the operative surface of the support element without being loosened by the etching head and without being in contact with the substrate,
feeding the substrates in succession across the etching head thereby bringing a corresponding portion of each substrate in contact with the dynamic drop previously formed on the operative surface of the support element, the dynamic drop transforming into a corresponding dynamic meniscus when contacted by the substrate.

15. The etching method according to claim 14, further including:
controlling a size of the dynamic meniscus by changing an inflow of the solution and/or a depression in each suction mouth.

16. The method according to claim 14, wherein the substrates are fed in succession without stopping across the etching head.

* * * * *